US012628353B2

(12) United States Patent
Chen et al.

(10) Patent No.: US 12,628,353 B2
(45) Date of Patent: May 12, 2026

(54) PACKAGE STRUCTURE

(71) Applicant: Advanced Semiconductor Engineering, Inc., Kaohsiung (TW)

(72) Inventors: Hai-Ming Chen, Kaohsiung (TW); Hung-Yi Lin, Kaohsiung (TW); Cheng-Yuan Kung, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 471 days.

(21) Appl. No.: 18/119,270

(22) Filed: Mar. 8, 2023

(65) Prior Publication Data

US 2024/0304584 A1　Sep. 12, 2024

(51) Int. Cl.
| | |
|---|---|
| *H01L 23/538* | (2006.01) |
| *H01L 23/00* | (2006.01) |
| *H10B 80/00* | (2023.01) |

(52) U.S. Cl.
CPC .......... *H01L 24/20* (2013.01); *H01L 23/5389* (2013.01); *H01L 24/08* (2013.01); *H01L 24/13* (2013.01); *H01L 24/16* (2013.01); *H10B 80/00* (2023.02); *H01L 24/05* (2013.01); *H01L 24/19* (2013.01); *H01L 2224/05647* (2013.01); *H01L 2224/08145* (2013.01); *H01L 2224/08265* (2013.01); *H01L 2224/13013* (2013.01); *H01L 2224/13014* (2013.01); *H01L 2224/13111* (2013.01); *H01L 2224/13139* (2013.01); *H01L 2224/13144* (2013.01); *H01L*

*2224/1403* (2013.01); *H01L 2224/14132* (2013.01); *H01L 2224/14134* (2013.01); *H01L 2224/14181* (2013.01); *H01L 2224/16145* (2013.01); *H01L 2224/16225* (2013.01); *H01L 2224/16265* (2013.01); *H01L 2224/19* (2013.01); *H01L 2224/211* (2013.01); *H01L 2224/214* (2013.01); *H01L 2924/1433* (2013.01); *H01L 2924/1436* (2013.01); *H01L 2924/1437* (2013.01)

(58) Field of Classification Search
CPC ...................................................... H01L 24/20
See application file for complete search history.

(56) References Cited

U.S. PATENT DOCUMENTS

| | | |
|---|---|---|
| 11,404,380 B2 | 8/2022 | Fang et al. |
| 2024/0194609 A1* | 6/2024 | Yen ..................... H01L 23/5383 |

* cited by examiner

*Primary Examiner* — William A Harriston
(74) *Attorney, Agent, or Firm* — Foley & Lardner LLP

(57) ABSTRACT

A package structure is provided. The package structure includes a semiconductor substrate. The semiconductor substrate includes a lower portion and an upper portion. The upper portion of the semiconductor substrate defines a high speed signal transmission region. The high speed signal transmission region includes a first region configured to communicate with a first electronic component and a second region configured to communicate with an external device. The lower portion of the semiconductor substrate defines a power transmission region.

16 Claims, 25 Drawing Sheets

1b

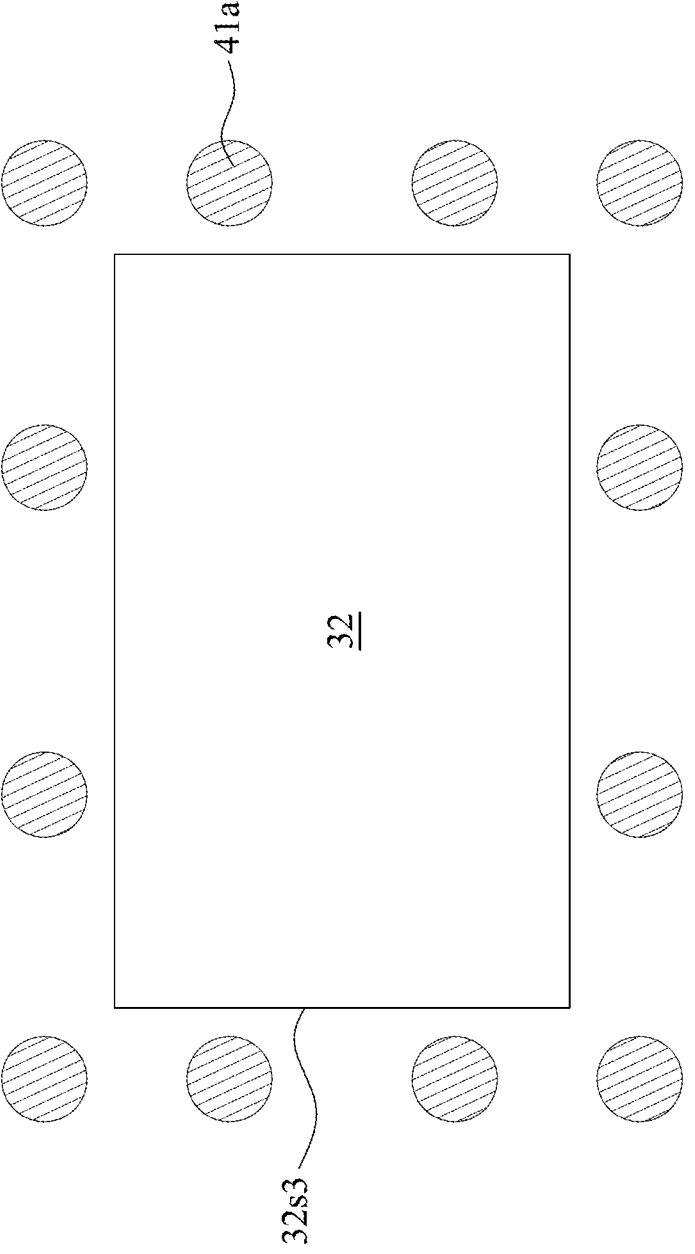
FIG. 10A

PACKAGE STRUCTURE

BACKGROUND

1. Field of the Disclosure

The present disclosure relates to a package structure, in particularly to a package structure including a semiconductor substrate which has I/O disposed at two opposite surfaces.

2. Description of the Related Art

When different electronic components, such as a memory device (e.g., SRAM) and an application-specific integrated circuit (ASIC), are integrated, the distance therebetween may affect performance. To enhance the performance, face-to-face bonding of an ASIC with a memory device may be adopted to provide shorter transmission path. In such cases, a redistribution structure between the ASIC and the memory device may be needed due to the size difference between the bumps of the ASIC and the memory device, additional redistribution structures and conductive pillars may also needed to communicate the ASIC and the memory device to an external device or circuit. As a result, the manufacture cost and the thickness of the overall structure are increased. In order to provide the desired enhancement in performance, a new package structure is required.

SUMMARY

In some embodiments, a package structure includes a semiconductor substrate. The semiconductor substrate includes a lower portion and an upper portion. The upper portion of the semiconductor substrate defines a high speed signal transmission region. The high speed signal transmission region includes a first region configured to communicate with a first electronic component and a second region configured to communicate with an external device. The lower portion of the semiconductor substrate defines a power transmission region.

In some embodiments, a package structure includes a semiconductor substrate. The semiconductor substrate has a first surface and a second surface opposite to the first surface. The semiconductor substrate includes a high density conductive layer disposed adjacent to the first surface and a low density conductive layer disposed adjacent to the second surface.

In some embodiments, a package structure includes a semiconductor substrate having a first surface and a second surface opposite to the first surface. The first surface of the semiconductor substrate defines a first signal transmission region configured to communicate with a first electronic component and a second signal transmission region configured to communicate with a second electronic component. The second surface of the semiconductor substrate defines a power transmission region.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 10A illustrates a layout of a conductive pillar(s) and an electronic component of a package structure according to some embodiments of the present disclosure.

FIG. 11H illustrates one or more stages of an example of a method for manufacturing a package structure according to some embodiments of the present disclosure.

Figure 1:
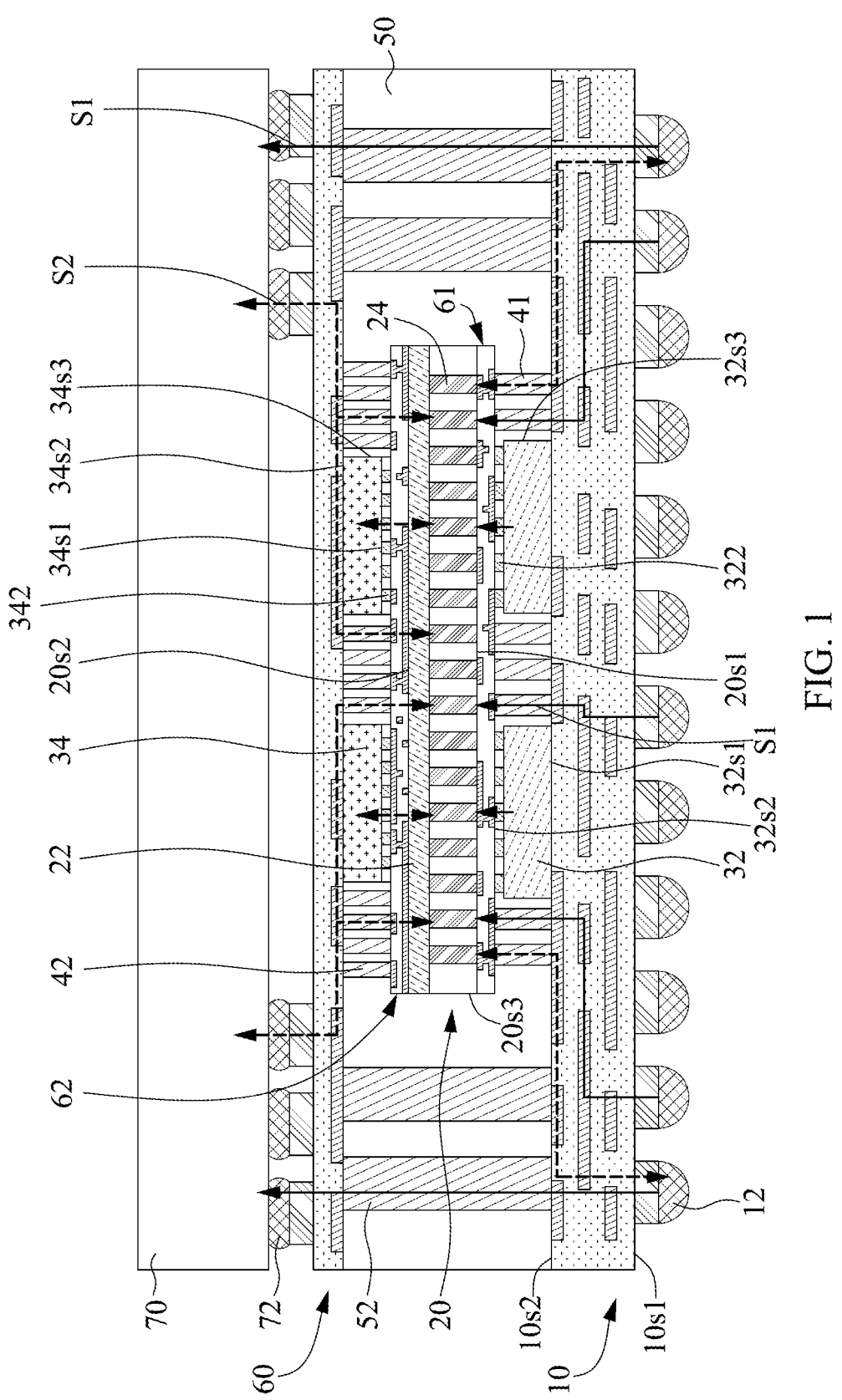
FIG. 1 illustrates a cross-sectional view of an example of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides many different arrangements, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include arrangements in which the first and second features are formed or disposed in direct contact, and may also include arrangements in which one or more additional features may be formed or disposed between the first and second features, such that the first and second features may not be in direct contact. In addition, the present disclosure may repeat reference numerals and/or letters in the various examples. The same reference numerals and/or letters refer to the same or similar parts. This repetition is for the purpose of simplicity and clarity and does not in itself dictate a relationship between the various arrangements and/or configurations.

Arrangements of the present disclosure are discussed in detail as follows. It should be appreciated, however, that the present disclosure provides many applicable concepts that can be embodied in a wide variety of specific contexts. The specific arrangements discussed are merely illustrative and do not limit the scope of the disclosure.

Figure 2:
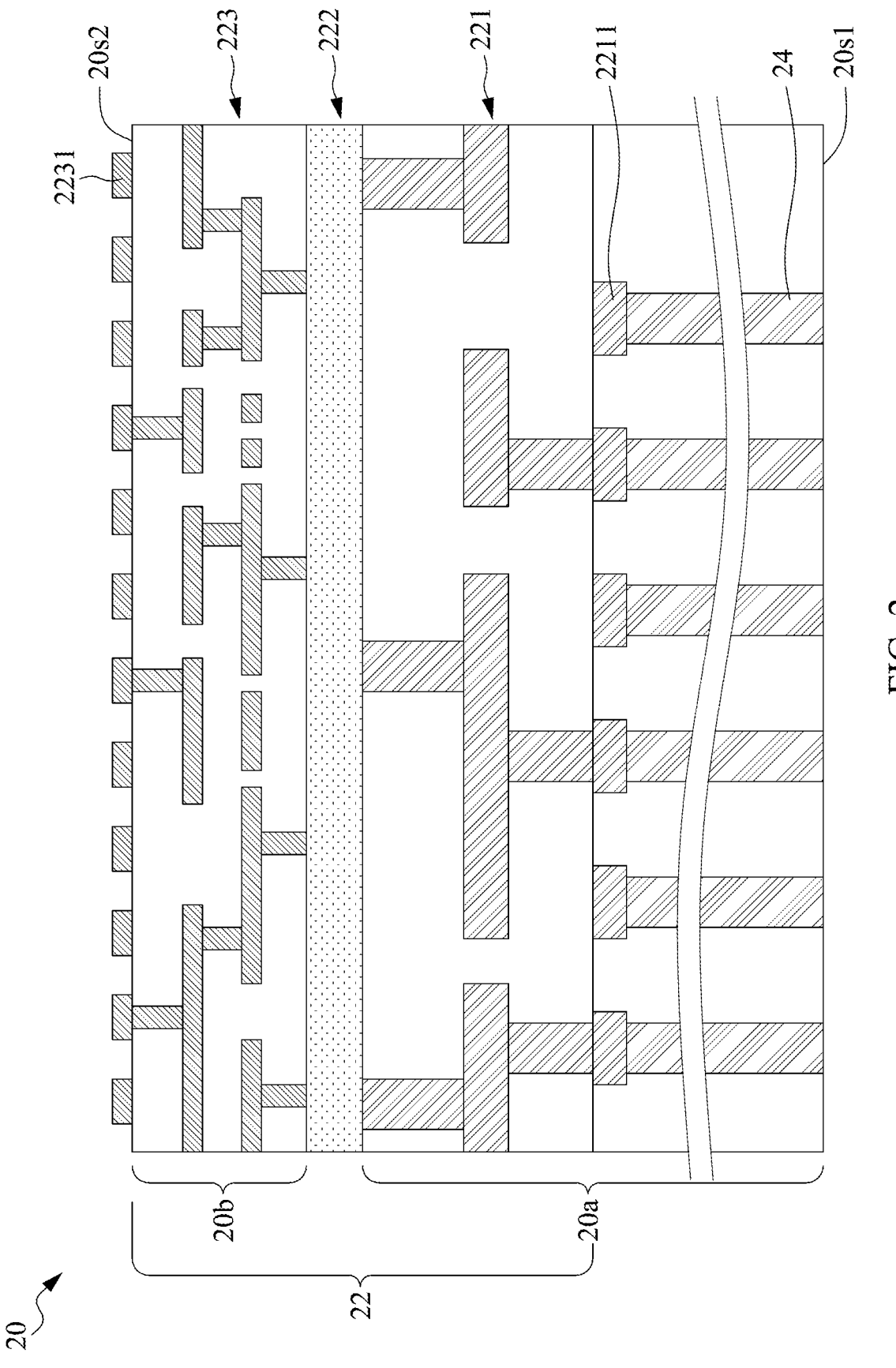
FIG. 2 illustrates a partial enlarged view of a substrate of a package structure according to some embodiments of the present disclosure.

FIG. 1 illustrates a cross-sectional view of an example of a package structure 1a according to some embodiments of the present disclosure. FIG. 2 illustrates a partial enlarged view of the substrate of the package structure 1a according to some embodiments of the present disclosure.

The package structure 1a may include a carrier 10, a substrate 20, electronic components 32, electronic components 34, conductive pillars 41, conductive pillars 42, an encapsulant 50, and a redistribution structure 60. As illustrated in FIG. 1, an external device, package or circuit (70) may be disposed over the package structure 1a and electrically connected to the package structure 1a through the redistribution structure 60. In some embodiments, the device, package or circuit (70) may be viewed as a part of the package structure 1a.

In some embodiments, the carrier 10 may be configured to support the substrate 20. In some embodiments, the carrier 10 may be configured to transmit power S1 (presented as a solid line), to the substrate 20. In some embodiments, the carrier 10 may be configured to transmit power S1, to the device, package or circuit 70. In some embodiments, the carrier 10 may be configured to transmit signal S2 (presented as a dotted line), such as data signal, to the substrate 20. The power S1 may include, for example, supply voltage, supply current, or the like. The signal S2 may include, for example, digital signal, analog signal, radio frequency (RF) signal, or the like. In some embodiments, the carrier 10 may include a circuit board, such as a paper-based copper foil laminate, a composite copper foil laminate, or a polymer-impregnated glass-fiber-based copper foil laminate. In some embodiments, the carrier 10 may be or include a redistribution structure, which includes one or more dielectric layers as well as conductive trace(s), conductive pad(s), and/or conductive via(s) embedded in or disposed on the dielectric layer(s). The carrier 10 may have a surface 10s1 (or a lower surface) and a surface 10s2 (or an upper surface) opposite to the surface 10s1.

The package structure 1a may include electrical connections 12. The electrical connection 12 may be disposed on or disposed under the surface 10s1 of the carrier 10. The electrical connection 12 may be configured to electrically connect the package structure 1a and an external device or circuit (not shown). The electrical connection 12 may include a solder material, which may include alloys of gold and tin solder or alloys of silver and tin solder, or other suitable materials.

The substrate 20 may be disposed on or disposed over the surface 10s2 of the carrier 10. The substrate 20 may be configured to transmit power S1 and/or signal S2. The substrate 20 may have a surface 20s1 (or a lower surface) a surface 20s2 (or an upper surface) opposite to the surface 20s1, and a surface 20s3 (or a lateral surface) extending between the surfaces 20s1 and 20s2. The surface 20s1 of the substrate 20 may face the surface 10s2 of the carrier 10. In some embodiments, the substrate 20 may be configured to transmit and/or receive signal S2 through surfaces 20s1 and/or 20s2. In some embodiments, the substrate 20 may be configured to transmit and/or receive power S1 through surface 20s1. The substrate 20 may include input and output (I/O) terminals (not annotated) disposed at the surfaces 20s1 and 20s2. The said I/O terminals of the substrate 20 may be configured to transmit and/or receive power S1 and/or signal S2. In some embodiments, the substrate 20 may be or include a semiconductor substrate. For example, the substrate 20 may include silicon, germanium or other suitable materials.

In some embodiments, the package structure 1a may include a circuit structure 22 and conductive vias 24. In some embodiments, the circuit structure 22 may be disposed adjacent to the surface 20s2 of the substrate 20. The conductive via 24 may be disposed adjacent to the surface 20s1 of the substrate 20. Please refer to FIG. 2, the circuit structure 22 may include a low density circuit layer 221 (or a low density conductive layer), an integrated circuit (IC) layer 222, and a high density circuit layer 223 (or a high density conductive layer). The integrated circuit (IC) layer 222 may include a transistor. In some embodiments, the integrated circuit (IC) layer 222 may be or include a metal oxide semiconductor field effect transistor (MOSFET) structure.

In some embodiments, the low density circuit layer 221 is closer to the surface 20s1 than the high density circuit layer 223 is. The low density circuit layer 221 may be disposed adjacent to the surface 20s1 of the substrate 20. The low density circuit layer 221 may be located between the surface 20s1 of the substrate 20 and the IC layer 222. In some embodiments, the low density circuit layer 221 may function as a power transmission region, which may be configured to transmit and/or receive power S1 as shown in FIG. 1. In some embodiments, the low density circuit layer 221 may abut the conductive via 24. The low density circuit layer 221 may be electrically connected to the conductive via 24. In some embodiments, power S1 as shown in FIG. 1 may be transmitted to the IC layer 222 through the low density circuit layer 221.

In some embodiments, the IC layer 222 may be disposed between the low density circuit layer 221 and the high density circuit layer 223. The IC layer 222 may be closer to the upper portion 20*b* than to the lower portion 20*a*. In some embodiments, the IC layer 222 may include active devices such as transistors and/or passive devices such as resistors, capacitors, inductors, or a combination thereof. For example, the IC layer 222 may include an application-specific IC (ASIC), a radio frequency integrated circuit (RFIC), a central processing unit (CPU), a microprocessor unit (MPU), a graphics processing unit (GPU), a microcontroller unit (MCU), a field-programmable gate array (FPGA), or another type of IC. In some embodiments, the IC layer 222 may be configured to transmit and/or receive power S1 as shown in FIG. 1. In some embodiments, the IC layer 222 may be configured to process, generate, and/or transmit signal, such as signal S2 as shown in FIG. 1.

In some embodiments, the high density circuit layer 223 may be located over the IC layer 222. The high density circuit layer 223 may be disposed adjacent to the surface 20*s*2 of the substrate 20 or abut the surface 20*s*2 of the substrate 20. The high density circuit layer 223 may be located between the surface 20*s*2 of the substrate 20 and the IC layer 222. In some embodiments, the high density circuit layer 223 may function as a high speed signal transmission region, which may be configured to transmit signal S2 as shown in FIG. 1. The high density circuit layer 223 may include a first region (not annotated) configured to communicate with one of the electronic components 34 as shown in FIG. 1, a second region (not annotated) configured to communicate with the device, package or circuit 70, and a third region (not annotated) configured to communicate with another one of the electronic components 34.

The conductive via 24 may be located between the surface 20*s*1 of the substrate 20 and the low density circuit layer 221. The conductive via 24 may extend between the low density circuit layer 221 and the second surface 20*s*1 of the substrate 20. The conductive via 24 may extend from the surface 20*s*1 of the substrate 20. The conductive via 24 may penetrate through at least a portion of the substrate 20. The conductive via 24 may include a through-via, such as a through-silicon via (TSV). The conductive via 24 may function as a power transmission region, which may be configured to transmit power S1 as shown in FIG. 1.

In some embodiments, the substrate 20 includes a lower portion 20*a* and an upper portion 20*b* (see FIG. 2). In some embodiments, the lower portion 20*a* may include the low density circuit layer 221 and the conductive via 24 and may abut the surface 20*s*1 of the substrate 20. In some embodiments, the upper portion 20*b* may include the high density circuit layer 223 and may abut the surface 20*s*2 of the substrate 20. In some embodiments, the line width/line space (L/S) of the upper portion 20*b* may be less than that of the lower portion 20*a*. For example, the conductive layer(s), conductive trace(s), conductive pad(s), and/or conductive via(s) of the upper portion 20*b* may have a dimension (e.g., width, diameter and/or surface area) less than that of the conductive layer(s), conductive trace(s), conductive pad(s), and/or conductive via(s) of the lower portion 20*a*. In some embodiment, the conductive layer(s), conductive trace(s), conductive pad(s), and/or conductive via(s) of the upper portion 20*b* may have a density (e.g., the number of conductive elements per unit area) greater than that of the conductive layer(s), conductive trace(s), conductive pad(s), and/or conductive via(s) of the lower portion 20*a*. In some embodiments, the conductive layer(s), conductive trace(s), conductive pad(s), and/or conductive via(s) of the upper portion 20*b* may have a pitch less than that of the conductive layer(s), conductive trace(s), conductive pad(s), and/or conductive via(s) of the lower portion 20*a*. In some embodiments, the density of the I/O terminals 2231 adjacent to or at the surface 20*s*2 of the substrate 20 may be greater than that of the I/O terminals (not shown) adjacent to or at the surface 20*s*1 of the substrate 20. In some embodiments, the density of the I/O terminals 2231 of the upper portion 20*b* may be greater than the density of I/O terminals 2211 of the lower portion 20*a*.

Please refer back to FIG. 1, in some embodiments, the package structure 1*a* may further include redistribution structures 61 and 62. In some embodiments, the redistribution structure 61 may be disposed on the surface 20*s*1 of the substrate 20. In some embodiments, the redistribution structure 61 may be disposed between the substrate 20 and the electronic component 32. The redistribution structure 61 may be electrically connected to the substrate 20. In some embodiments, the redistribution structure 62 may be disposed on the surface 20*s*2 of the substrate 20. In some embodiments, the redistribution structure 61 may be disposed between the substrate 20 and the electronic component 34. The redistribution structure 62 may be electrically connected to the substrate 20. In some embodiments, each of the redistribution structures 61 and 62 may include one or more dielectric layer and a conductive element(s) (e.g., conductive layer, conductive trace, conductive pad, and/or conductive via) disposed on or embedded in the dielectric layer(s). In some embodiments, the L/S of the redistribution structure 62 may be less than that of the redistribution structure 61.

In some embodiments, the redistribution structures 61 and 62 may be viewed as a part of the substrate 10. In such embodiments, the redistribution structures 61 and 62 are located at the lower portion 20*a* and the upper portion 20*b* of the substrate, respectively. The redistribution structure 62 may include high density circuit for high speed signal transmission and thus it may be viewed or referred to as the high density circuit layer and may have the features discussed above with respect to the upper portion 20*b* or the high density circuit layer 223. On the other hand, the redistribution structure 61 may include low density circuit and is configured for power transmission. The redistribution structure 61 may be viewed or referred to as the low density circuit layer and may have the features discussed above with respect to the lower portion 20*a* or the low density circuit layer 221.

The electronic component 32 may be disposed on or disposed over the surface 10*s*2 of the carrier 10. The electronic component 32 may be disposed on or disposed under the surface 20*s*1 of the substrate 20. The electronic component 32 may be disposed between the carrier 10 and the substrate 20. The electronic component 32 may be configured to modulate power S1. The electronic component 32 may be configured to receive power and transmit a modulated power to the substrate 20. For example, the electronic component 32 may be configured to stabilize a supply voltage (or supply current), and transmit a stabilized supply voltage (or supply current) to the substrate 20 through the surface 20*s*1. The electronic component 32 may have a surface 32*s*1 and a surface 32*s*2 opposite to the surface 32*s*1. The surface 32*s*2 of the electronic component 32 may abut and face the surface 20*s*1 of the substrate 20.

It should be noted that although FIG. 1 illustrates that the surface 32s1 of the electronic component 32 is in contact with the carrier 10, the surface 32s1 may be spaced apart from the carrier 10 in other embodiments. The electronic component 32 may include a passive device. In some embodiments, the electronic component 32 may be or include capacitor(s) (e.g., deep trench capacitor(s)), inductor(s), resistor(s), filter(s), or a combination thereof. The electronic component 32 may include terminals 322 over or at the surface 32s2. The terminals 322 may function as I/O terminals of the electronic component 32. In some embodiments, the terminal 322 may include a solder material or be bonded to the I/O terminals at the surface 20s2 of the substrate 20 through a solder material. The solder material may include alloys of gold and tin solder or alloys of silver and tin solder, or other suitable materials. In some embodiments, the pitch of the terminals 322 may range from about 50 μm to about 100 μm, such as 50 μm, 55 μm, 60 μm, 65 μm, 70 μm, 75 μm, 80 μm, 85 μm, 90 μm, 95 μm, or 100 μm.

The electronic component 34 may be disposed on or disposed over the surface 20s2 of the substrate 20. The electronic component 34 may be disposed between the substrate 20 and the redistribution structure 60. The electronic component 34 may be in communication with the substrate 20 (e.g., the high density circuit layer 223 of the substrate 20). The electronic component 34 may be configured to receive and/or transmit signal S2, from and/or toward the substrate 20. The electronic component 34 may have a surface 34s1 and a surface 34s2 opposite to the surface 34s1. The surface 34s1 of the electronic component 34 may abut and face the surface 20s2 of the substrate 20. In some embodiments, the surface 34s1 of the electronic component 34 may function as an active surface. The electronic component 34 may be or include a memory IC or memory die, such as a static random access memory (SRAM), a dynamic random access memory (DRAM), or other suitable ICs. The electronic component 34 may include terminals 342 over or at the surface 34s1. The terminals 342 may function as I/O terminals of the electronic component 34. In some embodiments, the terminal 342 may include a conductive pad surrounded by a passivation layer, and the terminal 342 may be bonded to the substrate 20 by a hybrid bonding technique, which involves a bonding between metal (or alloy) materials (such as Cu to Cu bonding) and a bonding between dielectric materials (such as oxide to oxide bonding). In some embodiments, the terminal 342 may be bonded to the substrate 20 by a flip chip bonding technique through a solder material which may include alloys of gold and tin solder or alloys of silver and tin solder, or other suitable materials. In some embodiments, the pitch of the terminals 342 may range from about 5 μm to about 50 μm, such as 5 μm, 10 μm, 15 μm, 20 μm, 25 μm, 30 μm, 35 μm, 40 μm, 45 μm, or 50 μm. In some embodiments, the pitch of the terminals 342 for hybrid bonding may be less than the pitch of the terminals 342 for flip chip bonding. In some embodiments, the pitch of the terminals 342 may be less than that of the terminals 322.

The conductive pillars 41 may be disposed on or disposed over the surface 10s2 of the carrier 10. The conductive pillars 41 may be disposed on or disposed under the surface 20s1 of the substrate 20. The conductive pillars 41 may be electrically connected to the low density circuit layer of the substrate. The conductive pillars 41 may extend between the carrier 10 and the substrate 20. The conductive pillars 41 may extend from the carrier 10 to the substrate 20. In some embodiments, the conductive pillars 41 may extend along a surface 32s3 (or side), which extends between the surfaces 32s1 and 32s2, of the electronic component 32. In some embodiments, the conductive pillars 41 may surround or be around the electronic component 32. In some embodiments, the conductive pillars 41 may be configured to electrically connect the carrier 10 and the substrate 20. In some embodiments, the conductive pillars 41 may be configured to transmit power S1 and/or signal S2. In some embodiments, the conductive pillars 41 may be configured to transmit power to the substrate 20 and further to the electronic component 34. In some embodiments, the conductive pillar 41 may be electrically connected to the power transmission region (e.g., via a conductive layer or structure of the second region of the power transmission region) The pitch of the conductive pillars 41 may range from about 30 μm to about 120 μm, such as 30 μm, 40 μm, 50 μm, 60 μm, 70 μm, 80 μm, 90 μm, 100 μm, 110 μm, or 120 μm.

The conductive pillars 42 may be disposed on or disposed over the surface 20s2 of the substrate 20. The conductive pillars 42 may be electrically connected to the high density circuit layer of the substrate. The conductive pillars 42 may disposed between the substrate 20 and the redistribution structure 60. In some embodiments, the conductive pillars 42 may extend along a surface 34s3 (or side), which extends between the surfaces 34s1 and 34s2, of the electronic component 34. In some embodiments, the conductive pillars 42 may surround or be around the electronic component 34. In some embodiments, the conductive pillars 42 may be configured to transmit signal S2, for example, from the substrate 20 to the device, package or circuit 70. In some embodiments, the conductive pillars 42 may be configured to transmit a signal S2 from the device, package or circuit 70 to the substrate 20. In some embodiments, the conductive pillar 42 may be electrically connected to the high speed signal transmission region (e.g., via a conductive layer or structure of the high speed signal transmission region). In some embodiments, the conductive pillars 42 may have a dimension (e.g., width, diameter, and/or surface area) substantially the same or less than that of the conductive pillars 41. In some embodiments, the pitch of the conductive pillars 42 may be substantially the same or less than that of the conductive pillars 41.

The encapsulant 50 may be disposed on or disposed over the surface 10s2 of the carrier 10. The encapsulant 50 may be disposed between the carrier 10 and the redistribution structure 60. In some embodiments, the encapsulant 50 may encapsulate the substrate 20. In some embodiments, the encapsulant 50 may encapsulate the electronic components 32. In some embodiments, the encapsulant 50 may encapsulate the electronic components 34. In some embodiments, the encapsulant 50 may encapsulate the conductive pillars 41. In some embodiments, the encapsulant 50 may encapsulate the conductive pillars 42. The encapsulant 50 may include insulation or dielectric material. For example, the encapsulant 50 may include a molding compound. In some embodiments, the encapsulant 50 may be made of molding material that may include, for example, a Novolac-based resin, an epoxy-based resin, a silicone-based resin, or other another suitable encapsulant. Suitable fillers may also be included, such as powdered $SiO_2$.

In some embodiments, the package structure 1a may further include conductive pillars 52. The conductive pillars 52 may be disposed on or disposed over the surface 10s2 of the carrier 10. The conductive pillars 52 may disposed between the carrier 10 and the redistribution structure 60. In some embodiments, the conductive pillars 52 may penetrate through the encapsulant 50. In some embodiments, the conductive pillars 52 may be encapsulated by the encapsulant 50. In some embodiments, the conductive pillars 52 may surround or be around the substrate 20. In some embodiments, the conductive pillar 52 may be configured to transmit power S1, from the carrier 10 to the device, package or circuit 70. In some embodiments, the conductive pillars 52 may be electrically connected to the ground. In some embodiments, the conductive pillars 52 may be configured to dissipate the heat of the package structure 1a and/or the heat of the device, package or circuit 70. The pitch of the conductive pillars 52 may range from about 100 μm to about 300 μm, such as 100 μm, 150 μm, 200 μm, 250 μm, or 300 μm. In some embodiments, the pitch of the conductive pillars 52 may be greater than 150 μm. In some embodiments, the pitch of the conductive pillars 52 may be greater than that of the conductive pillars 41. In some embodiments, the pitch of the conductive pillars 52 may be greater than that of the conductive pillars 42. In some embodiments, the conductive pillars 52 may have a dimension (e.g., width, diameter, and/or surface area) greater than that of the conductive pillars 41 (or 42).

The redistribution structure 60 may be disposed on or disposed over the surface 20s2 of the substrate 20. The redistribution structure 60 may be disposed on or disposed over the encapsulant 50. In some embodiments, the redistribution structure 60 may include one or more dielectric layers and a conductive element(s) (e.g., conductive layer, conductive trace, conductive pad, and/or conductive via) disposed on or embedded in the dielectric layer(s).

In some embodiments, the device, package or circuit 70 may be referred to as an external device, package or circuit. In some embodiments, the device, package or circuit 70 may be or include a memory die or memory package. The device, package or circuit 70 may be disposed on or disposed over the redistribution structure 60. The device, package or circuit 70 may be electrically connected to the substrate 20 through the redistribution structure 60. In some embodiments, the device, package or circuit 70 may be configured to transmit and/or receive power S1, from the carrier 10 through the conductive pillars 52, the redistribution structure 60 and the electrical connections 72. In some embodiments, the device, package or circuit 70 may be configured to transmit and/or receive signal S2, from the substrate 20 through the conductive pillars 42, the redistribution structure 60 and the electrical connections 72. In some embodiments, the device, package or circuit 70 may be a package which includes memory ICs (memory dies), other suitable ICs, and an interconnection.

The package structure 1a may further include electrical connections 72. The electrical connection 72 may be electrically connect the device, package or circuit 70 and the redistribution structure 60. The electrical connection 72 may include a solder material, which may include alloys of gold and tin solder or alloys of silver and tin solder, or other suitable materials.

In a comparative package structure, I/O terminals are arranged at the same surface (or side) of a substrate. For example, a comparative package structure may include a traditional memory package, a substrate (e.g., ASIC), memory dies (e.g., SRAMs), and passive devices vertically stacked in sequence from top to bottom. Such structure may compensate insufficient memory capacity of the traditional memory package. However, such structure requires multiple redistribution structures (e.g., between the traditional memory package and the substrate, between the substrate and the memory dies, or between the memory dies and the passive devices), conductive pillars, and molding layers, which increases cost and increases thickness of the overall structure; in addition, the number of I/O terminals is restricted. In the embodiments of the present disclosure, a substrate (e.g., 20) has I/O terminals on two opposite surfaces. One of the surfaces may be configured to receive power and/or transmit signal, and the other surface may be configured to transmit signal. Since the substrate includes more I/O terminals for signal transmission, it is advantageous to high-speed transmission. The substrate may include a high density circuit layer and a low density circuit layer arranged along a vertical direction. The high density circuit layer and I/O terminals adjacent to one side can be utilized for signal transmission (e.g., when hybrid bonding with the memory die), which increases the capacity of signal transmission without reducing the bandwidth of signal transmission between the substrate and the memory die. The lower density circuit layer and I/O terminals adjacent to the other side can be utilized for power transmission (e.g., when soldering bonding with a capacitor), which provides the function of power decoupling. In this embodiment, the electronic components 34, such as memory dies, may be electrically connected to the substrate face-to-face without a redistribution structure (or a circuit structure including a redistribution structure) therebetween, which can reduce propagation delay. In addition, conductive pillars (e.g., 41, 42) with the same or different dimensions, which may be configured to connect to ground/power, transmit signal, or release heat, can be used and disposed on the remaining surface areas of the substrate. As a result, the surface area of the substrate can be effectively utilized, the signal transmission can be enhanced and the performance of the package structure 1a can be enhanced.

Figure 3:
FIG. 3 illustrates a cross-sectional view of an example of a package structure according to some embodiments of the present disclosure.

FIG. 3 illustrates a cross-sectional view of an example of a package structure 1b according to some embodiments of the present disclosure. The package structure 1b is similar to the package structure 1a as shown in FIG. 1, and the differences therebetween are described below. Some elements, such as the redistribution structures 61 and 62 according to some embodiments, are omitted from the package structure 1b for brevity.

In some embodiments, the package structure 1b may include an electronic component(s) 36. In some embodiments, the electronic component 36 may be disposed on or disposed over the surface 10s1 of the carrier 10. The electronic component 36 may be configured to modulate power S1. In some embodiments, the electronic component 36 may be configured to manage and distribute power S1 to the substrate 20 and/or the device, package or circuit 70 through the carrier 10. The electronic component 36 may be or include, for example, a power management IC (PMIC) or other suitable ICs. The electronic component 36 may facilitate an operation which requires a relatively great power. As a result, the performance of the package structure 1b may be enhanced.

Figure 4:
FIG. 4 illustrates a cross-sectional view of an example of a package structure according to some embodiments of the present disclosure.

FIG. 4 illustrates a cross-sectional view of an example of a package structure 1c according to some embodiments of the present disclosure. The package structure 1c is similar to the package structure 1a as shown in FIG. 1, and the differences therebetween are described below. Some elements, such as the redistribution structures 61 and 62 according to some embodiments, are omitted from the package structure 1c for brevity.

In some embodiments, the conductive pillars 42 may have a dimension (e.g., width, diameter, and/or surface area) substantially the same as that of the conductive pillars 41. In some embodiments, the pitch of the conductive pillars 42 may be substantially the same as that of the conductive pillars 41. In some embodiments, the conductive pillar 42 may be vertically aligned with the conductive pillar 41.

Figure 5:
FIG. 5 illustrates a cross-sectional view of an example of a package structure according to some embodiments of the present disclosure.

FIG. 5 illustrates a cross-sectional view of an example of a package structure 1*d* according to some embodiments of the present disclosure. The package structure 1*d* is similar to the package structure 1*a* as shown in FIG. 1, and the differences therebetween are described below. Some elements, such as the redistribution structures 61 and 62 according to some embodiments, are omitted from the package structure 1*d* for brevity.

The package structure 1*d* may include electronic components 34-1 and 34-2. The electronic components 34-1 and 34-2 may be disposed on or disposed over the surface 20*s*2 of the substrate 20. The electronic components 34-1 and 34-2 may be arranged side by side. In some embodiments, the electronic components 34-1 and 34-2 may have different thicknesses. For example, a surface 34-1*s*2 (or an upper surface or a backside surface) of the electronic component 34-1 may be misaligned with a surface 34-2*s*2 (or an upper surface or a backside surface) of the electronic component 34-2. The surface 34-1*s*2 of the electronic component 34-1 may be located at an elevation (or height) different from that of the surface 34-2*s*2 of the electronic component 34-2. In some embodiments, the surface 34-1*s*2 of the electronic component 34-1 may be in contact with the redistribution structure 60, and the surface 34-2*s*2 of the electronic component 34-2 may be spaced apart from the redistribution structure 60. In some embodiments, a portion of the encapsulant 50 may be disposed between the electronic component 34-2 and the redistribution structure 60.

Figure 6:
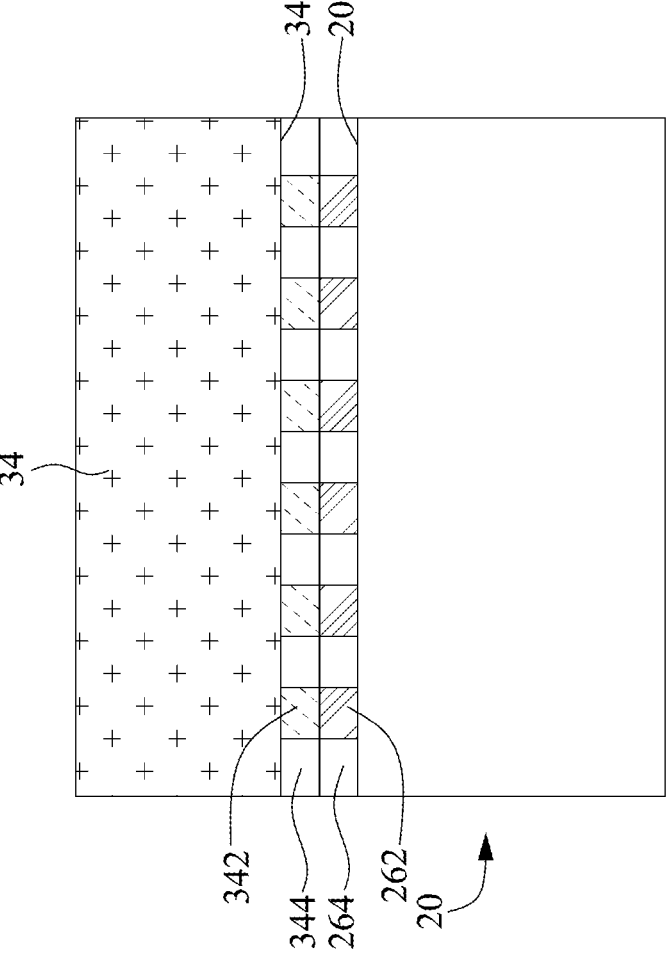
FIG. 6 illustrates a cross-sectional view of a package structure according to some embodiments of the present disclosure.

FIG. 6 illustrates a cross-sectional view of a package structure 1*e* according to some embodiments of the present disclosure.

The substrate 20 may include terminals 262 and a dielectric layer 264. The terminal 262 may be disposed on or disposed over the surface 20*s*2 (or the topmost surface) of the substrate 20. The terminals 262 may function as I/O terminals of the substrate 20. In some embodiments, the pitch of the terminals 262 may be less than that of the conductive vias 224 as shown in FIG. 1. The terminal 262 may include a conductive material(s), such as copper (Cu), aluminum (Al), tungsten (W), titanium (Ti), tantalum (Ta), or other applicable materials. The dielectric layer 264 may be disposed on or disposed over the surface 20*s*2 of the substrate 20. The dielectric layer 264 may surround the terminal 262. The dielectric layer 264 may include a dielectric material, such as oxide, nitride, oxynitride, polymer, or other suitable materials.

The electronic component 34 may include terminals 342 and a dielectric layer 344. The dielectric layer 344 may be disposed on or disposed over the surface 34*s*1 of the electronic component 34. The terminal 342 may include a conductive material(s), such as Cu, Al, W, Ti, Ta, or other applicable materials. The dielectric layer 344 may be disposed on or disposed over the surface 34*s*1 of the electronic component 34. The dielectric layer 344 may surround the terminal 342. The dielectric layer 344 may include a dielectric material, such as oxide, nitride, oxynitride, polymer, or other suitable materials.

In some embodiments, the electronic component 34 may be bonded to the substrate 20 by a hybrid bonding technique, which involves a bonding between metal (or alloy) materials and a bonding between dielectric materials. In some embodiments, the terminal 262 may be aligned and bonded with the terminal 342. In some embodiments, the dielectric layer 264 may be aligned and bonded with the dielectric layer 344. The hybrid bonding technique may facilitate the miniaturization of the terminal 262, which can increase the number of the terminals 262 per unit area.

Figure 7:
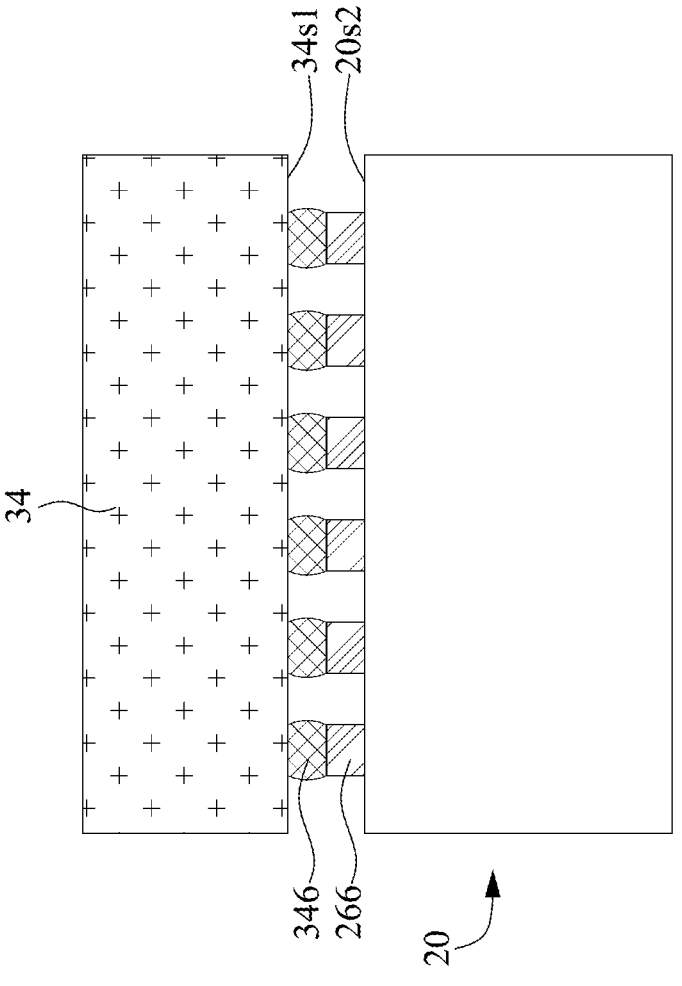
FIG. 7 illustrates a cross-sectional view of a package structure according to some embodiments of the present disclosure.
Figure 7:

FIG. 7 illustrates a cross-sectional view of a package structure 1*f* according to some embodiments of the present disclosure. The package structure 1*f* is similar to the package structure 1*e* as shown in FIG. 6, and the differences therebetween are described below.

The substrate 20 may include terminals 266. The terminal 266 may be disposed on or disposed over the surface 20*s*2 of the substrate 20. The terminal 266 may include, for example, a conductive pad or other suitable conductive elements. The electronic component 34 may include terminals 346. The terminals 346 may be disposed on or disposed over the surface 34*s*1 of the electronic component 34. In some embodiments, the electronic component 346 may include a solder material(s), which may include alloys of gold and tin solder or alloys of silver and tin solder, or other suitable materials. In some embodiments, the electronic component 34 may be attached to the substrate 20 through a flip chip bonding technique.

Figure 8:
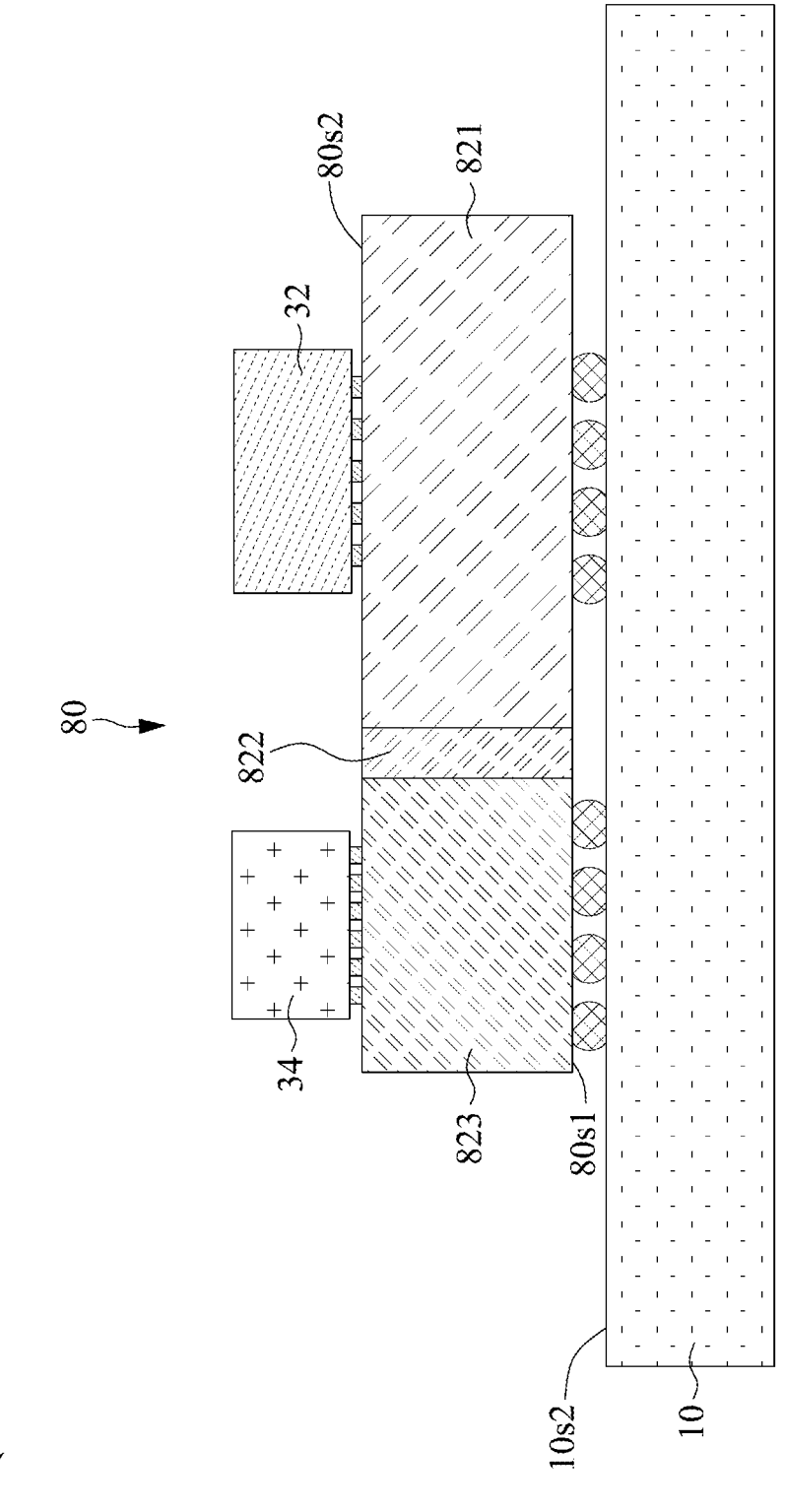
FIG. 8 illustrates a cross-sectional view of an example of a package structure according to some embodiments of the present disclosure.

FIG. 8 illustrates a cross-sectional view of an example of a package structure 1*g* according to some embodiments of the present disclosure.

The package structure 1*g* may include a substrate 80. The substrate 80 may be disposed on or disposed over the surface 10*s*2 of the carrier 10. The substrate 80 may be configured to transmit power and signal. The substrate 80 may include a surface 80*s*1 and a surface 80*s*2 opposite to the surface 80*s*1. The substrate 80 may include a low density circuit layer 821, an IC layer 822, and a high density circuit layer 823. In some embodiments, the low density circuit layer 821, the IC layer 822, and the high density circuit layer 823 may be arranged side by side. Each of the low density circuit layer 821, the IC layer 822, and the high density circuit layer 823 may be located between the surfaces 80*s*1 and 80*s*2. In some embodiments, each of the low density circuit layer 821, the IC layer 822, and the high density circuit layer 823 may extend between the surfaces 80*s*1 and 80*s*2.

In some embodiments, the low density circuit layer 821 may function as a power transmission region, which may be configured to transmit power. In some embodiments, the electronic component 32 may be disposed on or over the surface 80*s*2 of the substrate 80. In some embodiments, the electronic component 32 may be disposed on or disposed over the low density circuit layer 821 of the substrate 80. The electronic component 32 may be electrically connected to the IC layer 822 through the low density circuit layer 821.

In some embodiments, the IC layer 822 may be disposed between the low density circuit layer 821 and the high density circuit layer 823. In some embodiments, the IC layer 822 may include an ASIC or another type of IC.

In some embodiments, the high density circuit layer 823 may function as a high speed signal transmission region, which may be configured to transmit signal. In some embodiments, the electronic component 34 may be disposed on or over the surface 80*s*2 of the substrate 80. In some embodiments, the electronic component 34 may be disposed on or disposed over the high density circuit layer 823 of the substrate 80. The electronic component 34 may be electrically connected to the IC layer 822 through the high density circuit layer 823.

Figure 9A:
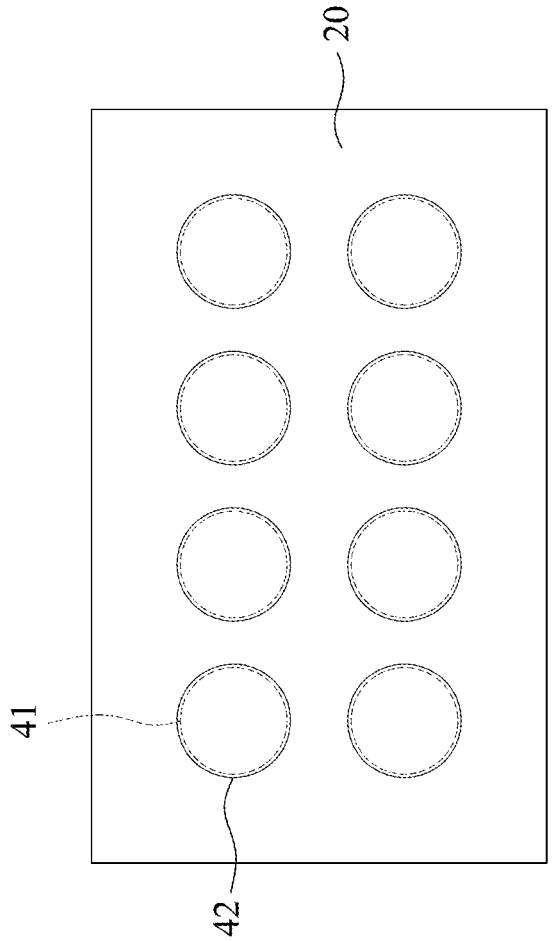
FIG. 9A illustrates a layout of conductive pillars of a package structure according to some embodiments of the present disclosure.
Figure 9A:
Figure 9A:

FIG. 9A illustrates a layout of conductive pillars of a package structure 1*h* according to some embodiments of the present disclosure. In some embodiments, the dimension (e.g., width, diameter, and/or surface area) of the conductive pillars 42 may be substantially the same as that of the conductive pillars 41. In some embodiments, the pitch of the conductive pillars 42 may be substantially the same as that of the conductive pillars 41. In some embodiments, the conductive pillar 42 may vertically overlap or aligned with the conductive pillar 41.

Figure 9B:
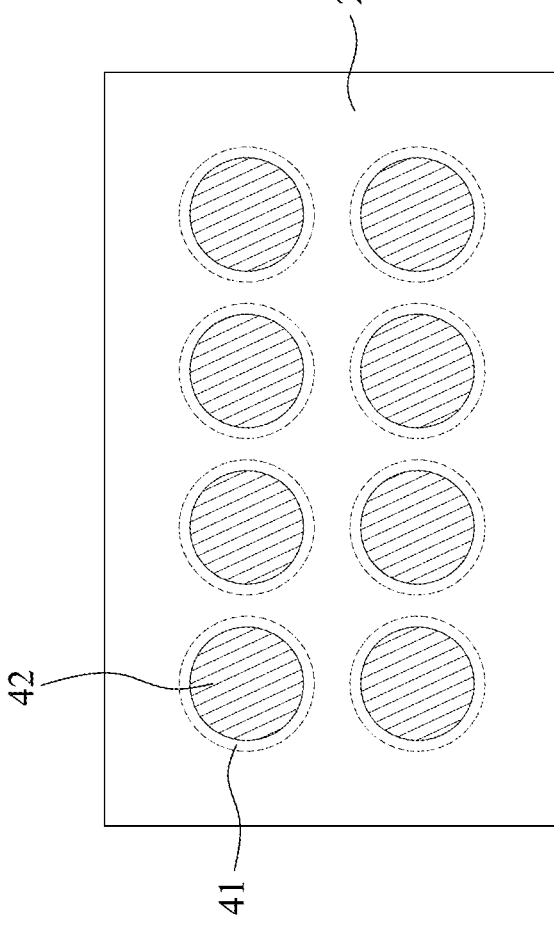
FIG. 9B illustrates a layout of conductive pillars of a package structure according to some embodiments of the present disclosure.
Figure 9B:

FIG. 9B illustrates a layout of conductive pillars of a package structure 1$i$ according to some embodiments of the present disclosure. In some embodiments, the dimension (e.g., width, diameter, and/or surface area) of the conductive pillars 42 may be less than that of the conductive pillars 41. In some embodiments, the conductive pillars 42 may be vertically overlap or aligned with the conductive pillars 41. In some embodiments, a portion of the conductive pillars 41 may be free from vertically overlapping the conductive pillars 42.

Figure 9C:
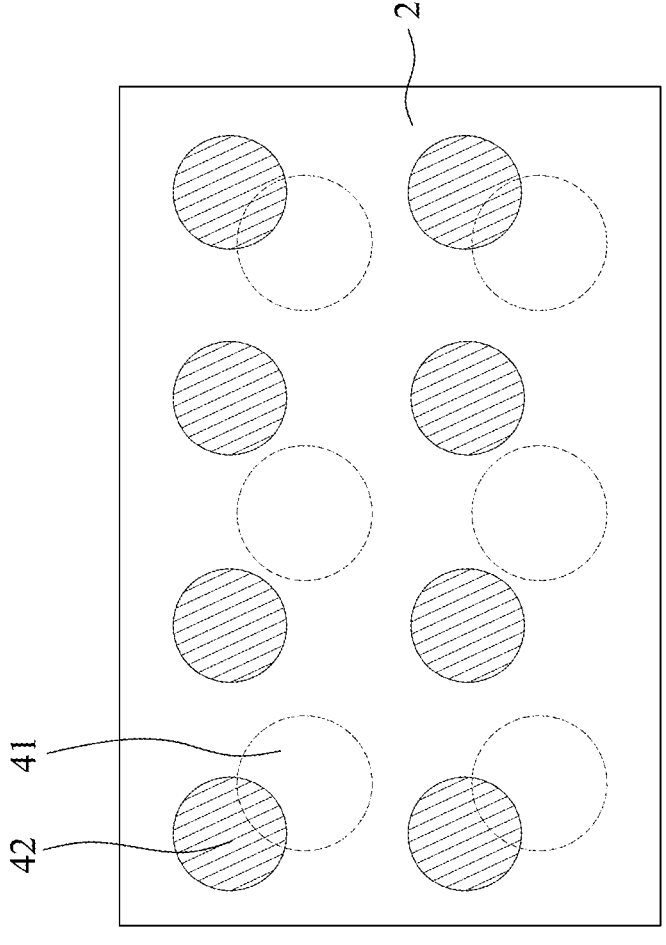
FIG. 9C illustrates a layout of conductive pillars of a package structure according to some embodiments of the present disclosure.
Figure 9C:

FIG. 9C illustrates a layout of conductive pillars of a package structure 1$j$ according to some embodiments of the present disclosure. In some embodiments, the dimension (e.g., width, diameter, and/or surface area) of the conductive pillars 42 may be less than that of the conductive pillars 41. In some embodiments, the pitch of the conductive pillars 42 may be less than that of the conductive pillars 41. In some embodiments, the conductive pillar 42 may be at least partially free from vertically overlapping the conductive pillar 41.

FIG. 10A illustrates a layout of a conductive pillar(s) and an electronic component of a package structure 1$k$ according to some embodiments of the present disclosure. In some embodiments, the package structure 1$k$ may include conductive pillars 41$a$. In some embodiments, the conductive pillar 41$a$ may have a circular profile or other suitable profiles or may be in a circular shape, from a top view. In some embodiments, the conductive pillars 41$a$ may surround the surface 32$s$3 of the electronic component 32. The conductive pillars 41$a$ may be configured to shield the electronic component 32 from electromagnetic interference (EMI).

Although not shown in FIG. 10A, in some embodiments, the package structure 1$k$ may include the conductive pillars 41 as illustrated in FIG. 1 configured to transmit power S1 and/or signal S2. In such embodiments, the package structure 1$k$ may further include the conductive pillars 41$a$ disposed between the conductive pillars 41 and electronic component 32, and the conductive pillars 41$a$ may be configured to shield the electronic component 32 from electromagnetic interference (EMI) or be configured to function as a shield between the electronic component 32 and the conductive pillars 41$a$.

Figure 10B:
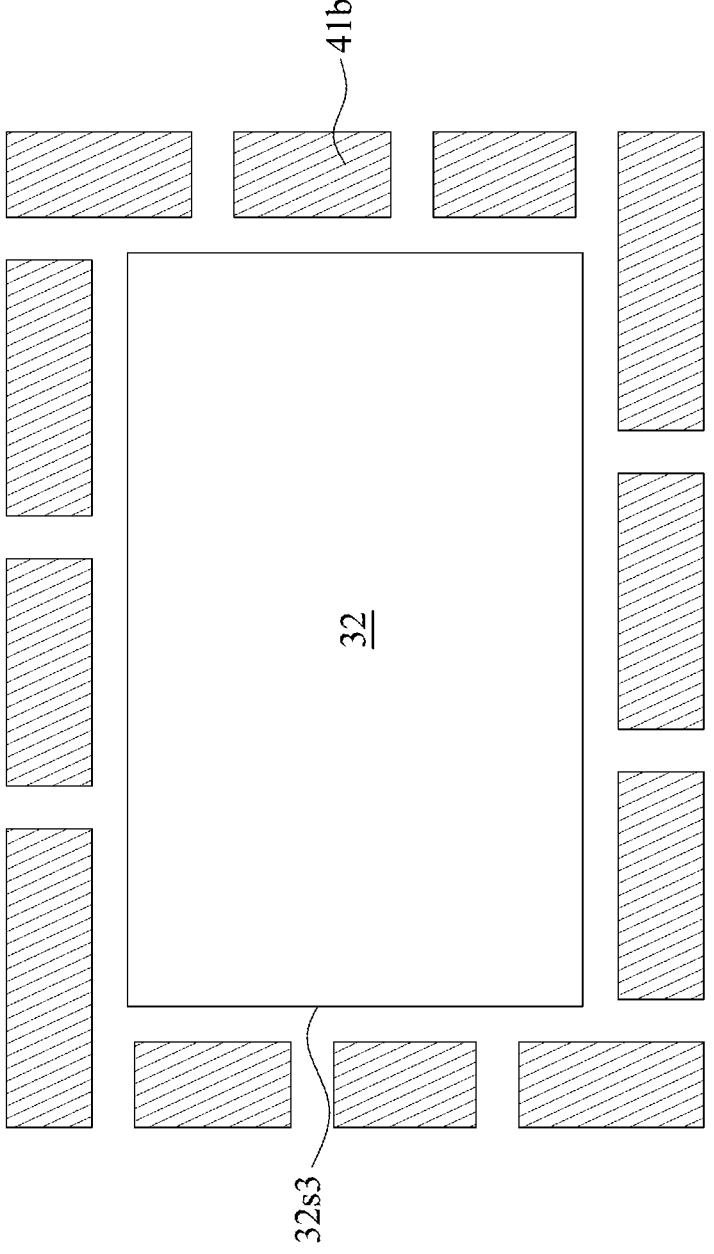
FIG. 10B illustrates a layout of a conductive pillar(s) and an electronic component of a package structure according to some embodiments of the present disclosure.
Figure 10B:

FIG. 10B illustrates a layout of a conductive pillar(s) and an electronic component of a package structure 1$l$ according to some embodiments of the present disclosure. In some embodiments, the package structure 1$l$ may include conductive pillars 41$b$. In some embodiments, the conductive pillars 41$b$ may have a strip profile or other suitable profiles or may be in a strip-like shape, from a top view. The conductive pillars 41$b$ may define at least one opening exposing the surface 32$s$3 of the electronic component 32. In some embodiments, the conductive pillars 41$b$ may surround the surface 32$s$3 of the electronic component 32. The conductive pillars 41$b$ may be configured to shield the electronic component 32 from EMI.

Figure 10C:
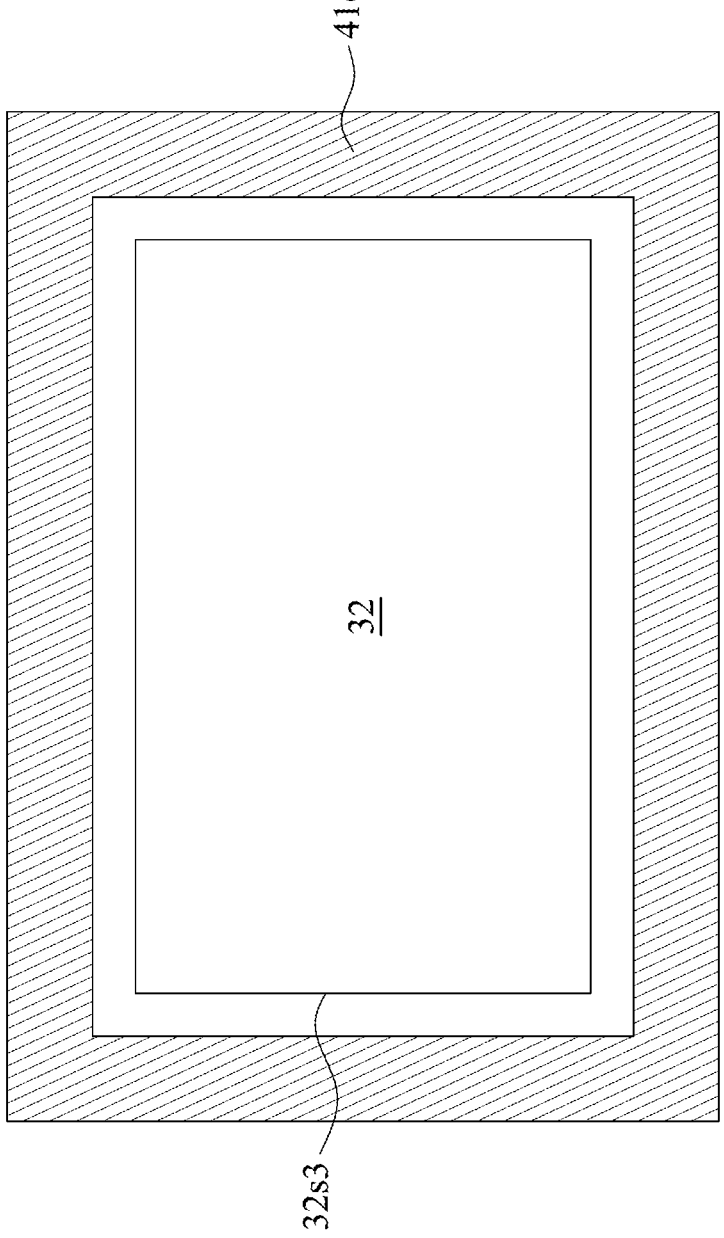
FIG. 10C illustrates a layout of a conductive pillar(s) and an electronic component of a package structure according to some embodiments of the present disclosure.
Figure 10C:

FIG. 10C illustrates a layout of a conductive pillar(s) and an electronic component of a package structure 1$m$ according to some embodiments of the present disclosure. In some embodiments, the package structure 1$m$ may include conductive pillars 41$c$. In some embodiments, the conductive pillars 41$c$ may have a ring-shaped profile or may be in a ring shape, from a top view. In some embodiments, the conductive pillars 41$c$ may completely surround the surface 32$s$3 of the electronic component 32. The conductive pillars 41$c$ may be configured to shield the electronic component 32 from EMI.

FIG. 11A to FIG. 11J illustrate various stages of an example of a method for manufacturing a package structure according to some embodiments of the present disclosure.

Figure 11A:
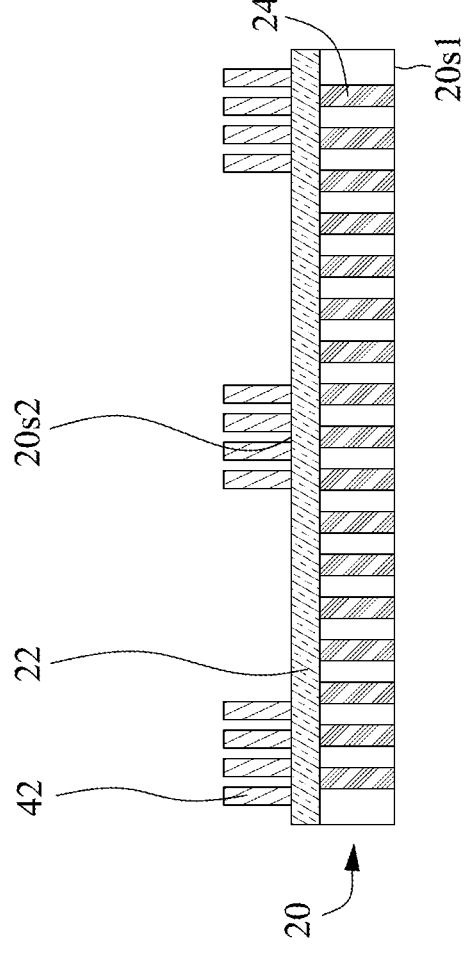
FIG. 11A illustrates one or more stages of an example of a method for manufacturing a package structure according to some embodiments of the present disclosure.

Referring to FIG. 11A, the substrate 20 may be provided. The circuit structure 22, including the low density circuit layer 221, the IC layer 222, and the high density circuit layer 223 as shown in FIG. 1B, may be formed adjacent to the surface 20$s$2 of the substrate 20. The conductive via 24 may be formed between the circuit structure 22 and the surface 20$s$1. The conductive pillars 42 may be formed on the surface 20$s$2 of the substrate 20. In some embodiments, redistribution structures, such as the redistribution structures 61 and 62 as shown in FIG. 1, may be formed on the surfaces 20$s$1 and 20$s$2 of the substrate 20, respectively.

Figure 11B:
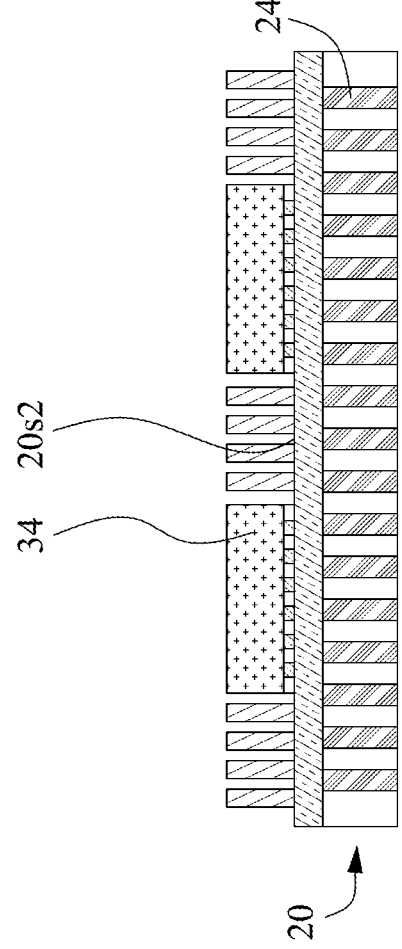
FIG. 11B illustrates one or more stages of an example of a method for manufacturing a package structure according to some embodiments of the present disclosure.

Referring to FIG. 11B, the electronic component 34 may be attached to the surface 20$s$2 of the substrate 20. In some embodiments, the electronic component 34 may be attached to the substrate 20 by a hybrid bonding technique. In other embodiments, the electronic component 34 may be attached to the substrate 20 through a flip chip bonding technique.

Figure 11C:
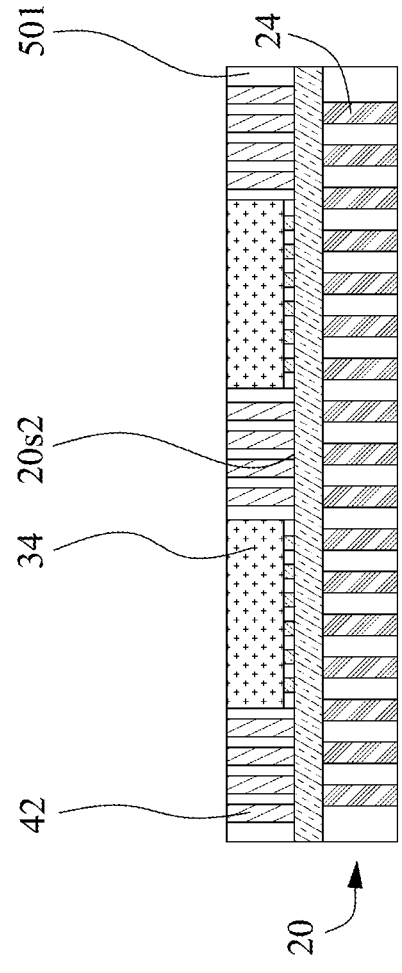
FIG. 11C illustrates one or more stages of an example of a method for manufacturing a package structure according to some embodiments of the present disclosure.

Referring to FIG. 11C, a molding layer 501 may be formed on the surface 20$s$2 of the substrate 20. The molding layer 501 may encapsulate the conductive pillars 42 and the electronic component 34.

Figure 11D:
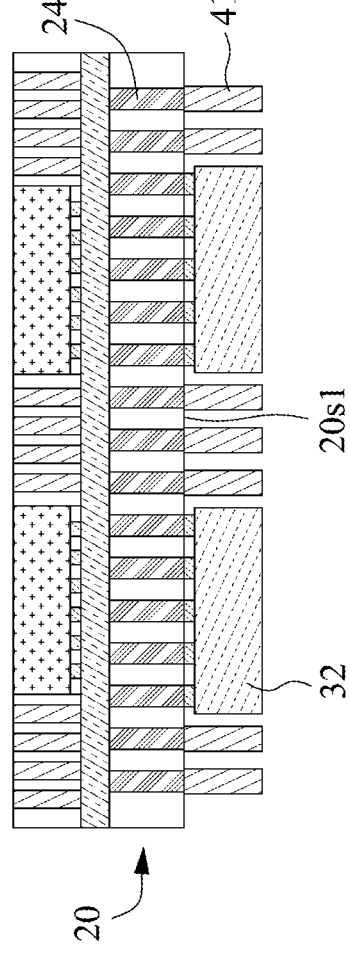
FIG. 11D illustrates one or more stages of an example of a method for manufacturing a package structure according to some embodiments of the present disclosure.

Referring to FIG. 11D, the electronic component 32 may be attached to the surface 20$s$1 of the substrate 20. The conductive pillars 41 may be formed on the surface 20$s$1 of the substrate 20. In some embodiments, the electronic component 32 may be attached to the substrate 20 through, for example, solder materials (e.g., solder bumps).

Figure 11E:
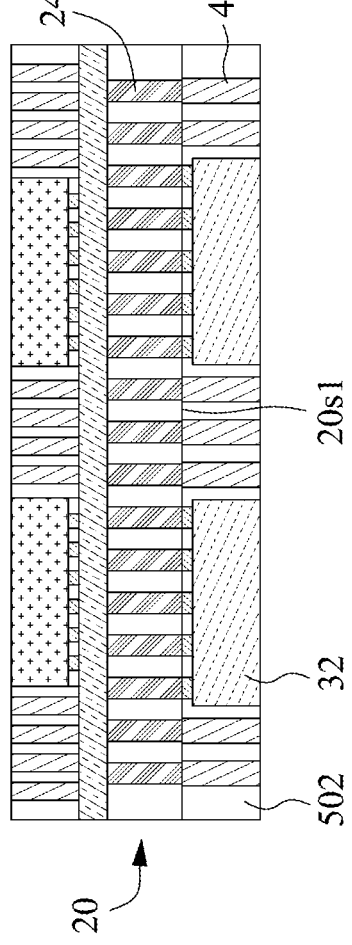
FIG. 11E illustrates one or more stages of an example of a method for manufacturing a package structure according to some embodiments of the present disclosure.

Referring to FIG. 11E, a molding layer 502 may be formed on the surface 20$s$1 of the substrate 20. The molding layer 502 may encapsulate the conductive pillars 41 and the electronic component 32.

Figure 11F:
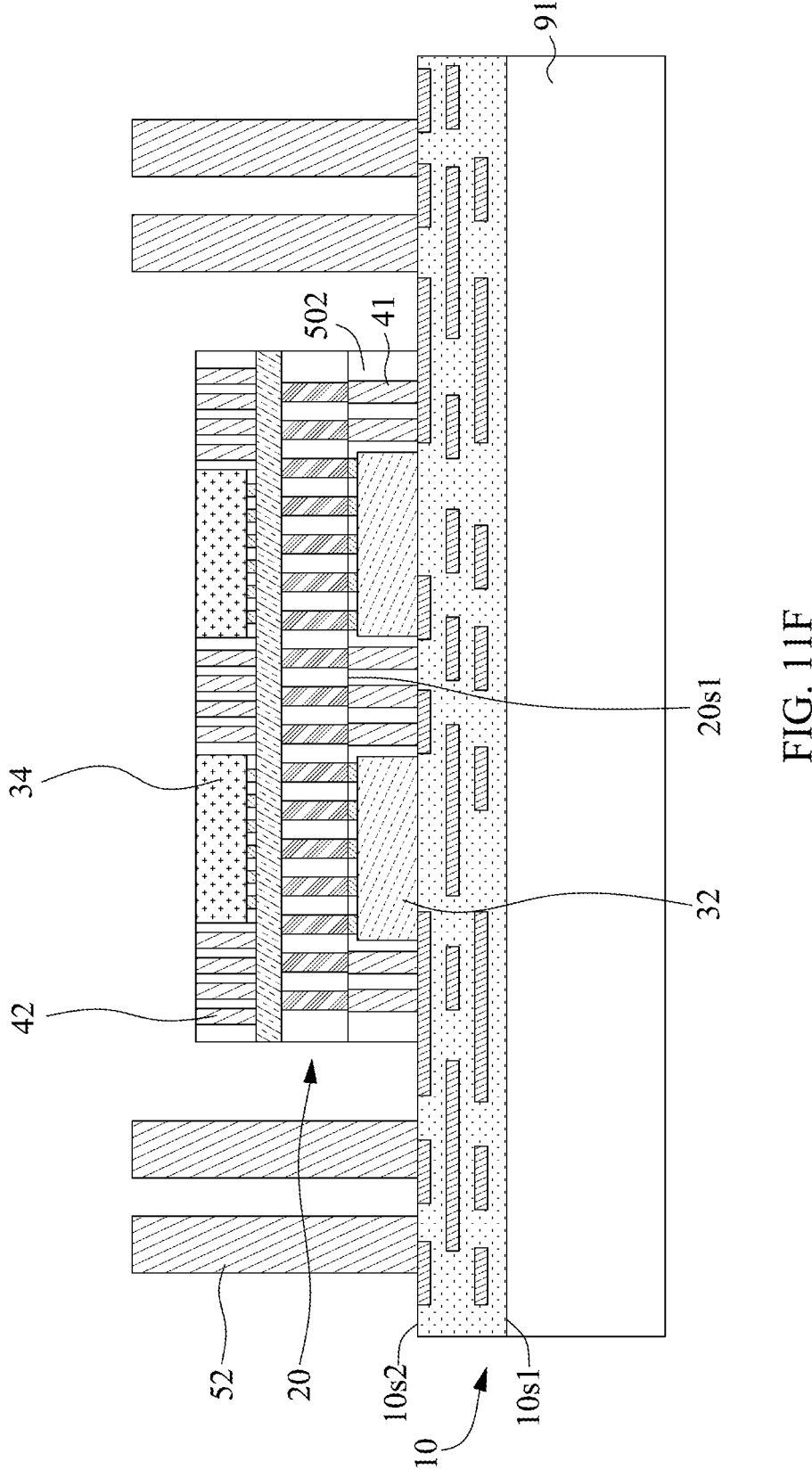
FIG. 11F illustrates one or more stages of an example of a method for manufacturing a package structure according to some embodiments of the present disclosure.

Referring to FIG. 11F, the carrier 10 may be provided. The surface 10$s$1 of the carrier 10 may be attached to a supporter 91. The supporter 91 may include a glass supporter, a plastic supporter, a ceramic supporter, and other suitable supporters. The carrier 10 may be configured to support the structure as shown in FIG. 11E, including the substrate 20, the electronic components 32 and 34, the conductive pillars 41 and 42, as well as the molding layers 501 and 502. The conductive pillars 41 may be bonded to the surface 10$s$2 of the carrier 10. The surface 20$s$1 of the substrate 20 may face the surface 10$s$2 of the carrier 10. The conductive pillars 52 may be formed on the surface 10$s$2 of the carrier 10.

Figure 11G:
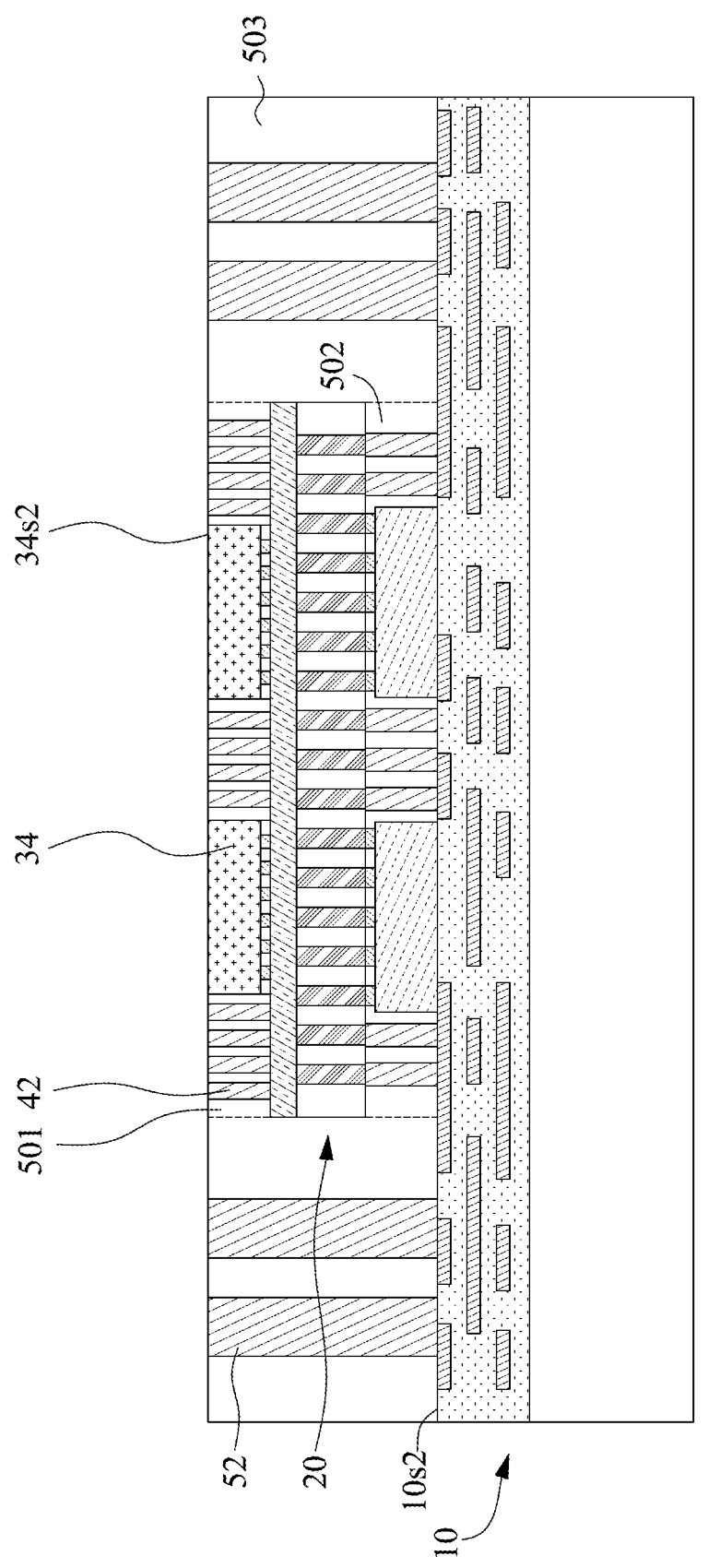
FIG. 11G illustrates one or more stages of an example of a method for manufacturing a package structure according to some embodiments of the present disclosure.
Figure 1I:
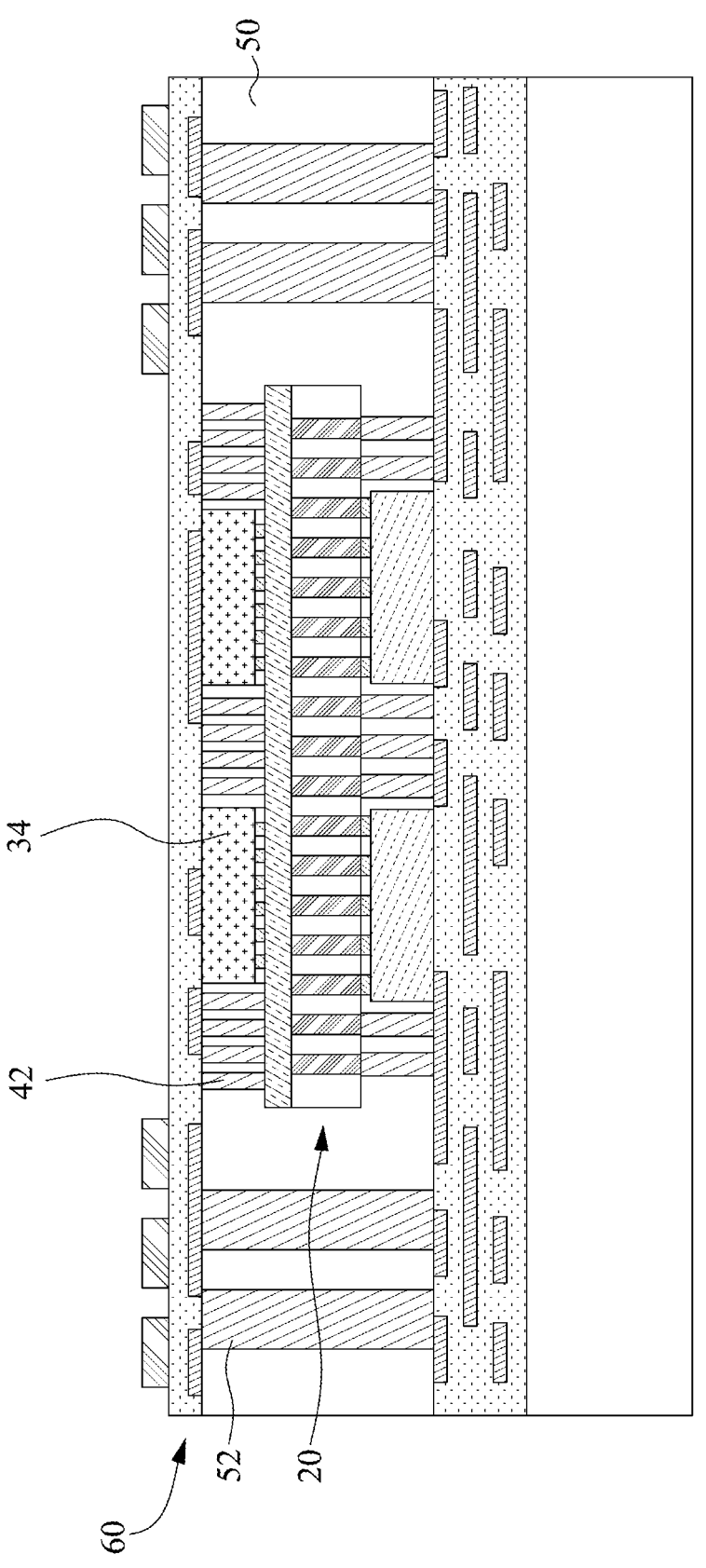

Referring to FIG. 11G, a molding layer 503 may be formed on the surface 10$s$2 of the carrier 10. The molding layer 503 may encapsulate the conductive pillars 52. The molding layer 503 may encapsulate the molding layers 501 and 502. The molding layer 503 may encapsulate the substrate 20. The molding layers 501, 502, 503 may define the encapsulant 50. A polishing technique, such as a chemical mechanical polishing (CMP), may be performed so that the upper surface of the conductive pillar 52, the upper surface of the conductive pillar 42, the upper surface of the electronic component 34 (e.g., 34$s$2), and the upper surface of the encapsulant 50 may be substantially coplanar.

Referring to FIG. 11H, the redistribution structure 60 may be formed on the encapsulant 50. The redistribution structure 60 may cover the conductive pillars 52. The redistribution structure 60 may cover the substrate 20. The redistribution structure 60 may cover the conductive pillars 42. The redistribution structure 60 may cover the electronic component 34.

Figure 11I:
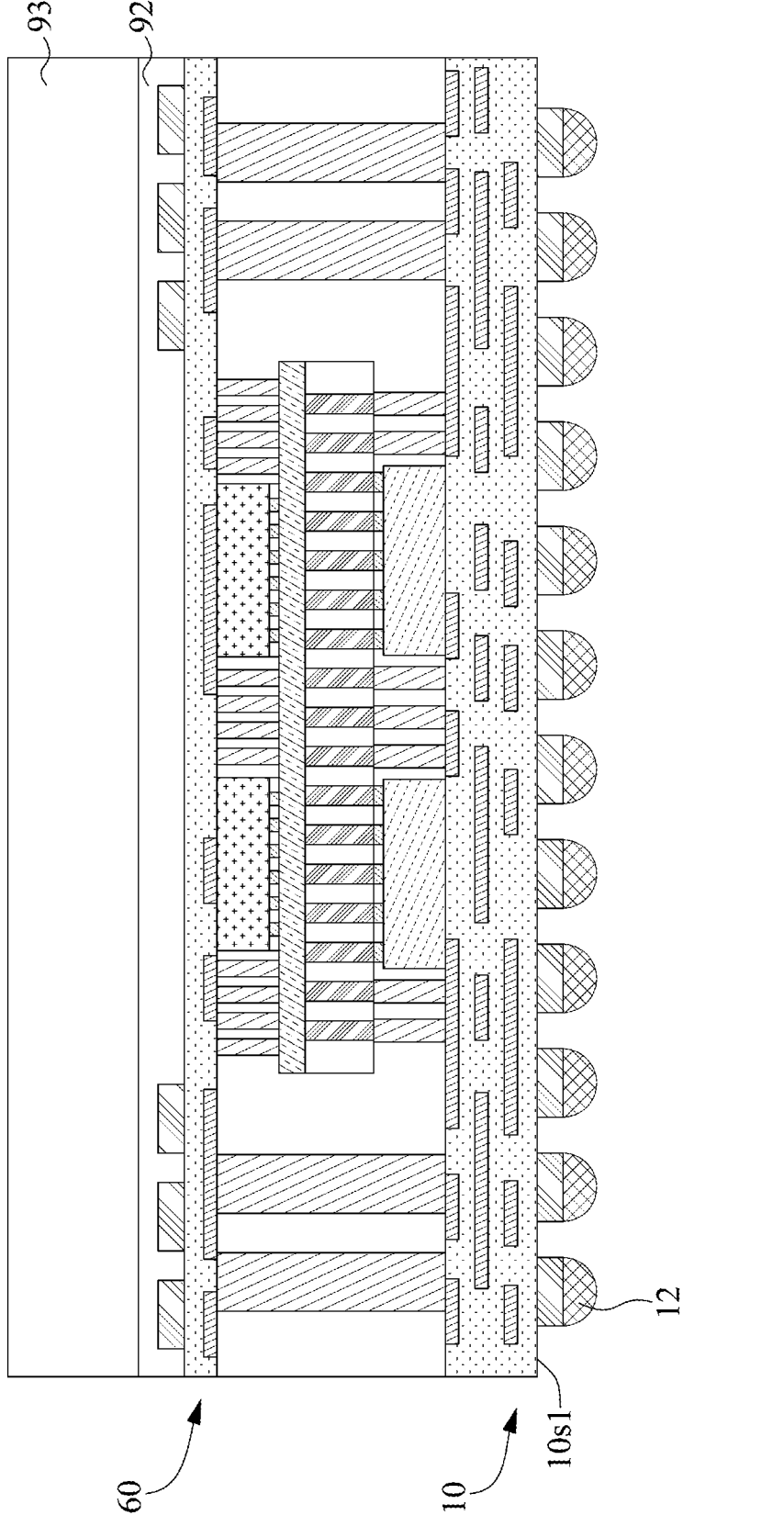
FIG. 11I illustrates one or more stages of an example of a method for manufacturing a package structure according to some embodiments of the present disclosure.

Referring to FIG. 11I, the redistribution structure 60 may be attach to a supporter 93 through a planarization layer 92. The planarization layer 92 may include a glue, a tape, or other suitable elements. The supporter 93 may include a glass supporter, a plastic supporter, a ceramic supporter, and other suitable supporters. The supporter 91 may be removed. The electrical connections 12 may be formed over the surface 10*s*1 of the carrier 10.

Figure 11J:
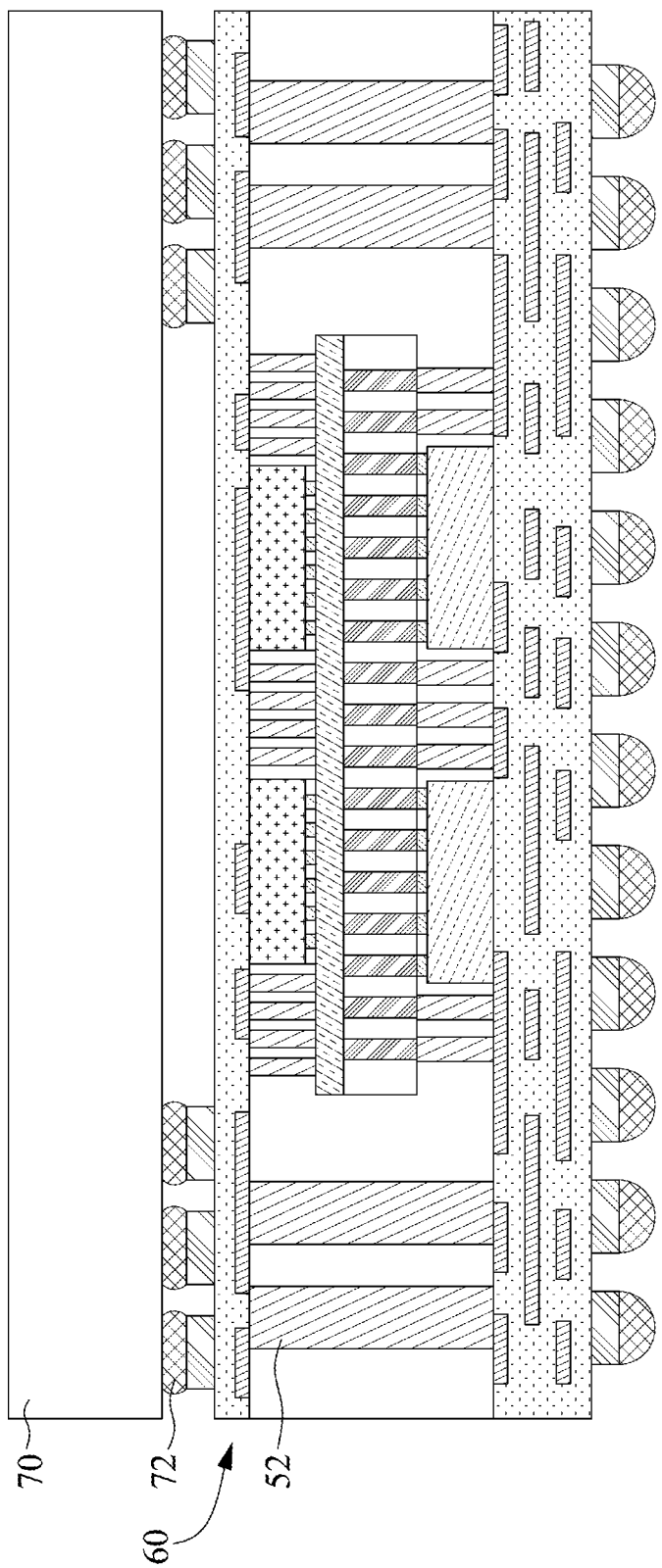
FIG. 11J illustrates one or more stages of an example of a method for manufacturing a package structure according to some embodiments of the present disclosure.

Referring to FIG. 11J, the planarization layer 92 and the supporter 93 may be removed. The device, package or circuit 70 may be bonded to the redistribution structure 60 through the electrical connection 72. As a result, a package structure, may be produced.

Figure 12:
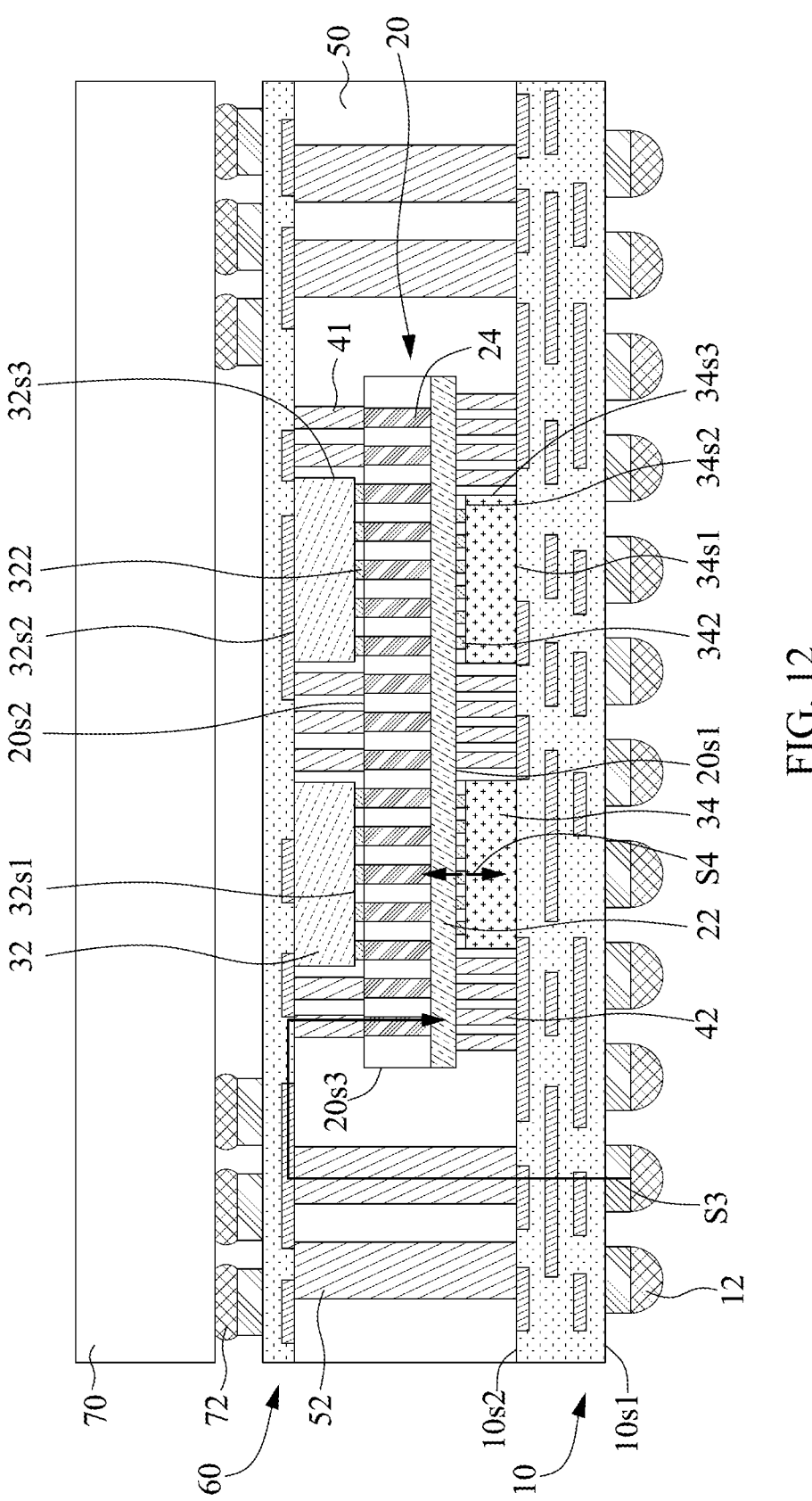
FIG. 12 illustrates a cross-sectional view of an example of a package structure according to some embodiments of the present disclosure.

FIG. 12 illustrates a cross-sectional view of an example of a package structure In according to some embodiments of the present disclosure. The package structure In is similar to the package structure 1*a* as shown in FIG. 1 and the redistribution structures 61 and 62 are omitted from the package structure In for brevity. The differences therebetween are described below.

In the package structure In, the substrate 20 is disposed up-side down as compared to the package structure 1*a*. In other words, the high density circuit layer 223 and the circuit structure 22 may be disposed adjacent to the surface 20*s*1 (i.e., the lower surface) of the substrate 20 while the low density circuit layer 221 and the conductive via 24 may be disposed adjacent to the surface 20*s*2 (i.e., the upper surface) of the substrate 20. In such embodiments, the electronic component 34 (e.g., a memory die) may be disposed on or disposed over the surface 10*s*2 of the carrier 10. The electronic component 34 may be disposed between the surface 20*s*1 of the substrate 20 and the surface 10*s*2 of the carrier 10. The electronic component 34 may be disposed under the surface 20*s*1 of the substrate 20. In some embodiments, the electronic component 32 (e.g., a passive device) may be disposed on or disposed over the surface 20*s*2 of the substrate 20. The electronic component 32 may be disposed between the surface 20*s*2 of the substrate 20 and the redistribution structure 60.

The conductive pillar 42 may be disposed between the surface 20*s*1 of the substrate 20 and the surface 10*s*2 of the carrier 10. The conductive pillar 42 may be disposed under the surface 20*s*1 of the substrate 20. The conductive pillar 41 may be disposed between the surface 20*s*2 of the substrate 20 and the redistribution structure 60.

In the package structure In, power S3 may be transmitted from the carrier 10 to the substrate (or the circuit structure 22 of the substrate 20) through the conductive pillar 52, the redistribution structure 60, the conductive pillar 41, and the conductive via 24. Signal S4 may be transmitted between the circuit structure 22 and the electronic component 34.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of arrangements of this disclosure are not deviated from by such an arrangement.

As used herein the term "active surface" may refer to a surface of an electronic component or passive element on which contact terminals such as contact pads are disposed.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, a first numerical value can be deemed to be "substantially" the same or equal to a second numerical value if the first numerical value is within a range of variation of less than or equal to +10% of the second numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, "substantially" perpendicular can refer to a range of angular variation relative to 90° that is less than or equal to +10°, such as less than or equal to +5°, less than or equal to +4°, less than or equal to ±3°, less than or equal to +2°, less than or equal to +1°, less than or equal to +0.5°, less than or equal to #0.1°, or less than or equal to #0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
a semiconductor substrate comprising a lower portion and an upper portion; and
wherein the upper portion of the semiconductor substrate defines a high speed signal transmission region, the high speed signal transmission region comprises a first region configured to communicate with a first electronic component and a second region configured to communicate with an external device, and wherein the lower portion of the semiconductor substrate defines a power transmission region,
and wherein the semiconductor substrate comprises an application specific integrated circuit (ASIC), and the first electronic component comprises a memory die.

2. The package structure of claim 1, further comprising:
a first conductive pillar electrically connected to a first conductive layer of the second region of the high speed signal transmission region, and the first conductive pillar extends along a lateral surface of the first electronic component.

3. The package structure of claim 2, wherein the external device is electrically connected to the first conductive pillar through a first redistribution structure disposed over the first conductive pillar.

4. The package structure of claim 3, further comprising:
a second conductive pillar disposed under the semiconductor substrate and electrically connected to a second conductive layer of the power transmission region, wherein the second conductive pillar is configured to transmit a power to the first electronic component and the semiconductor substrate,
and wherein the first conductive pillar has a first width, the second conductive pillar has a second width greater than the first width.

5. The package structure of claim 2, further comprising:
a second conductive pillar disposed under the semiconductor substrate and electrically connected to a second conductive layer of the power transmission region,
wherein the first conductive pillar is free from overlapping the second conductive pillar from a top view.

6. The package structure of claim 2, further comprising:
a second conductive pillar disposed under the semiconductor substrate and electrically connected to a second conductive layer of the power transmission region; and
a passive device disposed under the semiconductor substrate,
wherein the second conductive pillar extends along a lateral surface of the passive device.

7. The package structure of claim 6, wherein the passive device comprises an inductor, and the package structure further comprises a third conductive pillar disposed between the second conductive pillar and the passive device, wherein the third conductive pillar is configured to function as a shield between the second conductive pillar and the passive device.

8. The package structure of claim 1, wherein the semiconductor substrate comprises a metal oxide semiconductor field effect transistor structure closer to the upper portion than to the lower portion.

9. The package structure of claim 1, wherein the first electronic component is connected to the semiconductor substrate through hybrid bonding.

10. A package structure, comprising:
a semiconductor substrate having a first surface and a second surface opposite to the first surface, wherein the semiconductor substrate comprises a high density conductive layer disposed adjacent to the first surface and a low density conductive layer disposed adjacent to the second surface, and wherein the high density conductive layer is configured to transmit a signal in communication with a first electronic component, and the low density conductive layer is configured to transmit a power to the semiconductor substrate.

11. The package structure of claim 10, further comprising:
a plurality of first conductive pillars disposed over the first surface of the semiconductor substrate and electrically connected to the high density conductive layer; and
a plurality of second conductive pillars disposed under the second surface of the semiconductor substrate and electrically connected to the low density conductive layer,
wherein a first pitch of the plurality of first conductive pillars is less than a second pitch of the plurality of second conductive pillars.

12. The package structure of claim 11, wherein the first electronic component is disposed over the first surface and electrically connected to the high density conductive layer, and at least one of the plurality of first conductive pillars extends along a lateral surface of the first electronic component.

13. The package structure of claim 11, further comprising:
an encapsulant encapsulating the semiconductor substrate, the plurality of first conductive pillars, and the plurality of second conductive pillars.

14. The package structure of claim 13, further comprising:
a third conductive pillar encapsulated by the encapsulant, wherein the third conductive pillar is spaced apart from the plurality of first conductive pillars and the plurality of second conductive pillars.

15. The package structure of claim 14, wherein a width of the third conductive pillar is greater than a width of one of the plurality of first conductive pillars and a width of one of the plurality of second conductive pillars.

16. A package structure, comprising:
a semiconductor substrate having a first surface and a second surface opposite to the first surface,

wherein the first surface of the semiconductor substrate defines a first signal transmission region configured to communicate with a first electronic component and a second signal transmission region configured to communicate with a second electronic component, and the second surface of the semiconductor substrate defines a power transmission region; and a first conductive pillar disposed over the first surface of the semiconductor substrate and located between the first electronic component and the second electronic component.

*     *     *     *     *